United States Patent
Pearlstein et al.

(10) Patent No.: US 7,804,430 B2
(45) Date of Patent: Sep. 28, 2010

(54) METHODS AND APPARATUS FOR PROCESSING VARIABLE LENGTH CODED DATA

(75) Inventors: Larry Pearlstein, Newtown, PA (US); Richard Sita, Audubon, NJ (US); Richard Selvaggi, Doylestown, PA (US)

(73) Assignee: Broadcom Corporation

( * ) Notice: Subject to any disclaimer, the term of this patent is extended or adjusted under 35 U.S.C. 154(b) by 105 days.

(21) Appl. No.: 12/133,489

(22) Filed: Jun. 5, 2008

(65) Prior Publication Data
US 2008/0231482 A1 Sep. 25, 2008

Related U.S. Application Data

(62) Division of application No. 11/538,336, filed on Oct. 3, 2006, now Pat. No. 7,385,534, which is a division of application No. 11/046,048, filed on Jan. 28, 2005, now Pat. No. 7,132,963.

(60) Provisional application No. 60/609,511, filed on Sep. 13, 2004.

(51) Int. Cl.
H03M 7/40 (2006.01)
(52) U.S. Cl. ............ 341/67; 341/59; 341/65; 341/106; 341/107
(58) Field of Classification Search ............ 341/58, 341/59, 65, 67, 106, 107; 375/240.15; 345/520, 345/589
See application file for complete search history.

(56) References Cited

U.S. PATENT DOCUMENTS

| | | | |
|---|---|---|---|
| 4,068,298 A | 1/1978 | Dechant et al. | |
| 4,764,896 A | 8/1988 | Freimark et al. | |
| 5,369,405 A * | 11/1994 | Choi et al. ............ | 341/63 |
| 5,479,166 A | 12/1995 | Read et al. | |
| 5,512,896 A | 4/1996 | Read et al. | |
| 5,539,401 A | 7/1996 | Kumaki et al. | |
| 5,784,631 A * | 7/1998 | Wise ............ | 382/246 |
| 5,835,145 A | 11/1998 | Ouyang et al. | |
| 5,852,469 A | 12/1998 | Nagai et al. | |
| 5,969,650 A | 10/1999 | Wilson | |
| 6,011,498 A * | 1/2000 | Wittig ............ | 341/67 |
| 6,014,095 A * | 1/2000 | Yokoyama ............ | 341/67 |
| 6,069,575 A * | 5/2000 | Kinouchi et al. ............ | 341/67 |
| 6,313,766 B1 * | 11/2001 | Langendorf et al. ............ | 341/67 |
| 6,317,461 B1 | 11/2001 | Chujoh et al. | |

(Continued)

OTHER PUBLICATIONS

Wong, S. et al.; Future Directions of (Programmable and Reconfigurable) Embedded Processors.

(Continued)

*Primary Examiner*—Linh V Nguyen
(74) *Attorney, Agent, or Firm*—McAndrews, Held & Malloy, Ltd.

(57) ABSTRACT

An apparatus for processing variable length coded data includes a coefficient buffer unit and several lookup tables. The coefficient buffer unit includes a coefficient memory and an index register for storing an indication of a non-zero nature of coefficients stored in the coefficient memory. Advantageously, the lookup tables may be altered to adapt the apparatus for processing variable length coded data to handle encoding or decoding video adhering to a specific standard. Furthermore, the lookup tables may be adapted to accelerate the determination of the presence of escape codes and the subsequent handling of the escape codes.

6 Claims, 16 Drawing Sheets

U.S. PATENT DOCUMENTS

| | | |
|---|---|---|
| 6,573,846 B1 | 6/2003 | Trivedi et al. |
| 6,636,222 B1 | 10/2003 | Valmiki et al. |
| 6,650,785 B2 | 11/2003 | Boon |
| 6,674,376 B1 | 1/2004 | Nishimura |
| 6,799,246 B1 * | 9/2004 | Wise et al. .................. 711/117 |
| 7,132,963 B2 | 11/2006 | Pearlstein et al. |
| 7,262,718 B2 * | 8/2007 | Sugisawa .................... 341/64 |
| 7,460,041 B2 * | 12/2008 | Yang et al. .................. 341/107 |
| 2007/0139228 A1 | 6/2007 | Pearlstein et al. |
| 2007/0194957 A1 | 8/2007 | Watanabe |

OTHER PUBLICATIONS

Van Dusen, Chuck; MPEG-2 Tutorial, MPEGoverview.ppt.
Knee, Mike; MPEG Video; Mar. 2002; Snell & Wilcox.

\* cited by examiner

| 0 | 1 | 2 | 3 | 4 | 5 | 6 | 7 |
|---|---|---|---|---|---|---|---|
| 8 | 9 | 10 | 11 | 12 | 13 | 14 | 15 |
| 16 | 17 | 18 | 19 | 20 | 21 | 22 | 23 |
| 24 | 25 | 26 | 27 | 28 | 29 | 30 | 31 |
| 32 | 33 | 34 | 35 | 36 | 37 | 38 | 39 |
| 40 | 41 | 42 | 43 | 44 | 45 | 46 | 47 |
| 48 | 49 | 50 | 51 | 52 | 53 | 54 | 55 |
| 56 | 57 | 58 | 59 | 60 | 61 | 62 | 63 |

902

| 0 | 1 | 5 | 6 | 14 | 15 | 27 | 28 |
|---|---|---|---|---|---|---|---|
| 2 | 4 | 7 | 13 | 16 | 26 | 29 | 42 |
| 3 | 8 | 12 | 17 | 25 | 30 | 41 | 43 |
| 9 | 11 | 18 | 24 | 31 | 40 | 44 | 53 |
| 10 | 19 | 23 | 32 | 39 | 45 | 52 | 54 |
| 20 | 22 | 33 | 38 | 46 | 51 | 55 | 60 |
| 21 | 34 | 37 | 47 | 50 | 56 | 59 | 61 |
| 35 | 36 | 48 | 49 | 57 | 58 | 62 | 63 |

904

| 0 | 1 | 8 | 16 | 9 | 2 | 3 | 10 |
|---|---|---|---|---|---|---|---|
| 17 | 24 | 32 | 25 | 18 | 11 | 4 | 5 |
| 12 | 19 | 26 | 33 | 40 | 48 | 41 | 34 |
| 27 | 20 | 13 | 6 | 7 | 14 | 21 | 28 |
| 35 | 42 | 49 | 56 | 57 | 50 | 43 | 36 |
| 29 | 22 | 15 | 23 | 30 | 37 | 44 | 51 |
| 58 | 59 | 52 | 45 | 38 | 31 | 39 | 46 |
| 53 | 60 | 61 | 54 | 47 | 55 | 62 | 63 |

METHODS AND APPARATUS FOR PROCESSING VARIABLE LENGTH CODED DATA

CROSS REFERENCE TO RELATED APPLICATIONS

This application is a divisional of co-pending U.S. application Ser. No. 11/538,336, filed Oct. 3, 2006, entitled "METHODS AND APPARATUS FOR PROCESSING VARIABLE LENGTH CODED DATA", having as inventors Larry Pearlstein et al., and owned by instant assignee, which is a divisional of U.S. application Ser. No. 11/046,048 (now U.S. Pat. No. 7,132,963), filed Jan. 28, 2005, entitled "METHODS AND APPARATUS FOR PROCESSING VARIABLE LENGTH CODED DATA", having as inventors Larry Pearlstein et al., and owned by instant assignee, which claims the benefit of prior provisional application Ser. No. 60/609,511, filed Sep. 13, 2004, the contents of which are hereby incorporated herein by reference.

FIELD OF THE INVENTION

The present invention relates to processing of variable length coded data and, more particularly, to methods and apparatus for such processing.

BACKGROUND

There has recently been a great deal of interest in supporting a wide array of standards for video encoding and decoding in consumer products. Digital video standards of commercial interest include: the International Standards Organization (ISO) MPEG-2 and MPEG-4 standards; the Microsoft® VC-1 draft standard; the International Telecommunication Union Telecommunication Standardization Sector (ITU-T) H.263 and H.264 standards; the On2 VP6 standard; and the digital videotape (DV) standard.

It is likely that multi-standard video encoders and decoders will become more prevalent in coming years in a wide array of products. Such products may include: set-top boxes for receiving video over cable, digital subscriber line (DSL), satellite link and/or the Internet; digital TVs; personal video recorders; handheld devices (including personal digital assistants, dedicated personal video players and mobile phones); and wireless devices. High performance processors will be required for running applications on these widely varied products.

Fixed function variable length coder/decoder units are available, where "fixed function" refers to the fact that such units are dedicated to a particular standard, for example, the H.264 standard. Fixed function variable length coder/decoder units may also be found in typical MPEG-2 video encoder and video decoder chips including the Xilleon™ 200 family of chips from ATI Technologies Inc. of Markham, Ontario, Canada. Unfortunately, fixed function variable length coder/decoder units lack the flexibility to work across a variety of video compression methods.

It is also known that variable length coding/decoding may also be performed by a general purpose reduced instruction set computer (RISC) processor or a complex instruction set computer (CISC) processor, such as those found in personal computers. However, such high-performance general purpose processors are hard to characterize in terms of worst case performance, due to the dependence of general purpose processors on the statistical behavior of instruction and data caches. Additionally, general purpose processors are expensive to implement, as they require large die area. General purpose processors are also relatively inefficient at handling variable-length data, since they are implicitly designed for processing byte-aligned data.

Many of the digital video standards transform eight pixel by eight pixel arrays that are representative of a portion of a frame in a digital video sequence. The result of this transformation may be called a block of coefficients. The block of coefficients may be encoded using variable length codes as a form of efficient compression. A macroblock may be defined to include four eight-by-eight luminance blocks of coefficients and two eight-by-eight chrominance blocks of coefficients.

The output of a video encoder in some standards is known as an Elementary Stream (ES). The lowest-level entity in the ES is an encoded block of coefficients. Each encoded block is terminated by an end-of-block code. A macroblock may be formed by concatenating the four luminance blocks and the two chrominance blocks. The six encoded blocks may be preceded by a macroblock header that contains control information belonging to the macroblock: spatial address, motion vectors, prediction modes, field/frame DCT mode, quantizer step size. The result is a coded macroblock.

Variable length codes often arise out of attempts to compress an amount of data to be transmitted. One type of variable length code is the "run-level" type of code. Run-level codes recognize situations in which a sequence of values are to be transmitted, where many of the values are null (0). The code replaces a long series of null values with an indication of the value (level) that follows the series and an indication of the length (nm) of the series. Through the use of such a code, a series of 28 0-valued bits that precede a value of 17 may be reduced to an indication of the 17 (a level value) and five bits (a run value) indicating that there is a series of 28 null values ahead of the 17.

Compression codes also include so-called entropy encoding schemes wherein the most common symbols are mapped to the shortest code strings. An example of an entropy encoding scheme is Huffman coding, which is used in the MPEG-2 standard. In the MPEG-2 standard, for example, blocks of coefficients are first run-level encoded and then each run-level combination (symbol) is Huffman encoded.

Run-level encoding, in particular, requires that a block of coefficients be written into locations in a coefficient buffer. A run-level encoder may then read the coefficient buffer, location by location, to determine run-level combinations representative of the block of coefficients. In the reverse, decoding, case, a run-level decoder receives run-level combinations and uses the run-level combinations to formulate a block of coefficients in a coefficient buffer. As there are typically many null entries in a block of coefficients, it may be considered that the writing, by the run-level decoder, of null entries to the coefficient buffer is inefficient.

Huffman encoding, in particular, requires that a code be determined to correspond to each received run-level combination. For the sake of efficiency, a single code may map to more than one run-level combination. For instance, a maximum run value may be defined and a given run-level combination may include a given run value and a given level value. When the given run value exceeds the maximum run value, the maximum run value may be subtracted from the given run value to provide an intermediate run value. The code generated then corresponds to a combination of the intermediate run value and the given level value. To distinguish this code from the same code generated when the received run value is equivalent to the intermediate run value just determined, the former code may be preceded by an "escape code". In particular, the escape code may identify the following code to be a "delta-run" code. A "delta-level" code may be similarly determined and identified.

Determining an escape code to generate based on received run and level values can be a complex and processor-time consuming exercise. Existing encoders are known to either implement a hardwired approach, which is inherently inflexible, or implement a programmed approach on a general-purpose RISC processor or a purpose-specific processor. Unfortunately, such existing approaches do not specifically accelerate the determining and handling of escape codes.

Clearly, then, there is a need for methods and apparatus for efficiently encoding and decoding data that manipulates variable length coded data efficiently at very high processing rates.

SUMMARY

An apparatus for processing variable length coded data includes a coefficient buffer unit and several lookup tables. The lookup tables, in particular, may be adapted to accelerate the determination of the presence of escape codes and the subsequent handling of the escape codes. For instance, a lookup table may select, based on results of a number of comparisons, a type of escape code from among a plurality of types of escape code. Alternatively, a lookup table may select, based on some received values and some values located in the lookup table, a type of escape code from among a plurality of types of escape code. Further, an escape code may be identified by correlating an initial bit pattern in a received code to known bit patterns related to escape codes.

Additionally, the coefficient buffer unit may include a memory and an index register for storing an indication of a non-zero nature of coefficients stored in the memory. Advantageously, the index register allows for more efficient processing of blocks of coefficients during both encoding and decoding. Furthermore, the lookup tables may be altered to adapt the apparatus for processing variable length coded data to handle encoding or decoding video adhering to a specific standard.

According to an aspect of the present invention, there is provided a method of populating a memory for use in decoding a stream of encoded values. The method includes initializing, to an initial value, a pointer to a memory location in the memory, receiving a run value and an associated level value in the stream, updating the pointer using the run value, to give an updated pointer, populating a memory location in the memory, the memory location in the memory identified by the updated pointer, using the level value and populating a memory location in an index register, the memory location in the index register identified by the updated pointer, to indicate that the memory location in the memory identified by the updated pointer has been populated. In another aspect of the invention, a run-level decoding apparatus is provided for carrying out this method.

According to another aspect of the present invention, there is provided a method of handling coefficient data received from a first memory. The method includes receiving a coefficient value stored in the first memory at a given address, receiving an index register value stored in an index register at an address corresponding to the given address and determining, based on the index register value, whether to write the coefficient value to a second memory. In another aspect of the invention, a direct memory access apparatus is provided for carrying out this method.

According to still another aspect of the present invention, there is provided a method of run-level encoding. The method includes initializing a value of a first pointer to a first memory location in a memory that includes a plurality of memory locations, receiving a coefficient vector having a plurality of indexed coefficient vector elements corresponding to the plurality of memory locations, incrementing a value of a second pointer to a location in the coefficient vector until the second pointer references a location of a given indexed coefficient vector element that indicates a presence of a coefficient in a second memory location in the memory, where the second memory location corresponds to the given indexed coefficient vector element, determining a difference between the value of the first pointer and the value of the second pointer, determining a run value based on the difference, outputting the run value, reading, from the second memory location, a coefficient value and outputting the coefficient value as a level value. In another aspect of the invention, a run-level encoding apparatus is provided to carry out this method.

According to a further aspect of the present invention, there is provided a programmable apparatus for processing variable length coded data. The programmable apparatus includes a memory having a plurality of memory locations, a register storing a pointer to a particular memory location of the plurality of memory locations, a lookup table storing a reference to the pointer associated, at least in part, with a run value and a level value and a processor. The processor is adapted to execute a sequence of instructions stored in the memory and responsive to receiving the reference to the register, branch the executing away from the sequence to execute an instruction stored in the particular memory location.

According to a still further aspect of the present invention, there is provided an escape code selection apparatus for producing variable length coded data. The escape code selection apparatus includes a first comparator adapted to compare a received run value to a previously stored run value to produce a first comparison result, a second comparator adapted to compare a received level value to a previously stored level value to produce a second comparison result and a logic unit adapted to select, based, at least in part, on the first comparison result and the second comparison result, a type of escape code from among a plurality of types of escape code.

According to an even further aspect of the present invention, there is provided a method of producing variable length coded data. The method includes receiving a run value represented as a run plurality of bits, receiving a level value represented as a level plurality of bits, forming an address by combining the run value and the level value, using the address to determine a value for a disambiguation bit, determining a maximum level value for the run value, determining a maximum run value for the level value and selecting, based, at least in part, on the run value, the level value, the maximum run value, the maximum level value, the disambiguation bit and previously stored values, a type of escape code from among a plurality of types of escape code. In another aspect of the invention, an escape code selection apparatus is provided for carrying out this method.

According to an even further aspect of the present invention, there is provided a method of handling variable length coded data. The method includes receiving a string of binary digits, receiving a prefix first portion length, comparing a first number of binary digits of the string to a reference string, where the first number is equivalent to the prefix first portion length, based on the comparing, generating a positive match indicator and generating an output string having a predetermined prefix second portion length, where the output string includes values of a second number of binary digits in the string of binary digits that directly follow the first number of binary digits, where the second number is equivalent to the prefix second portion length. In another aspect of the invention, an escape code correlator is provided for carrying out this method.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate example embodiments of this invention:

FIG. 9 illustrates arrays of memory locations for the scan table and a coefficient memory for the coefficient buffer unit of FIG. 3;

DETAILED DESCRIPTION

Figure 1:
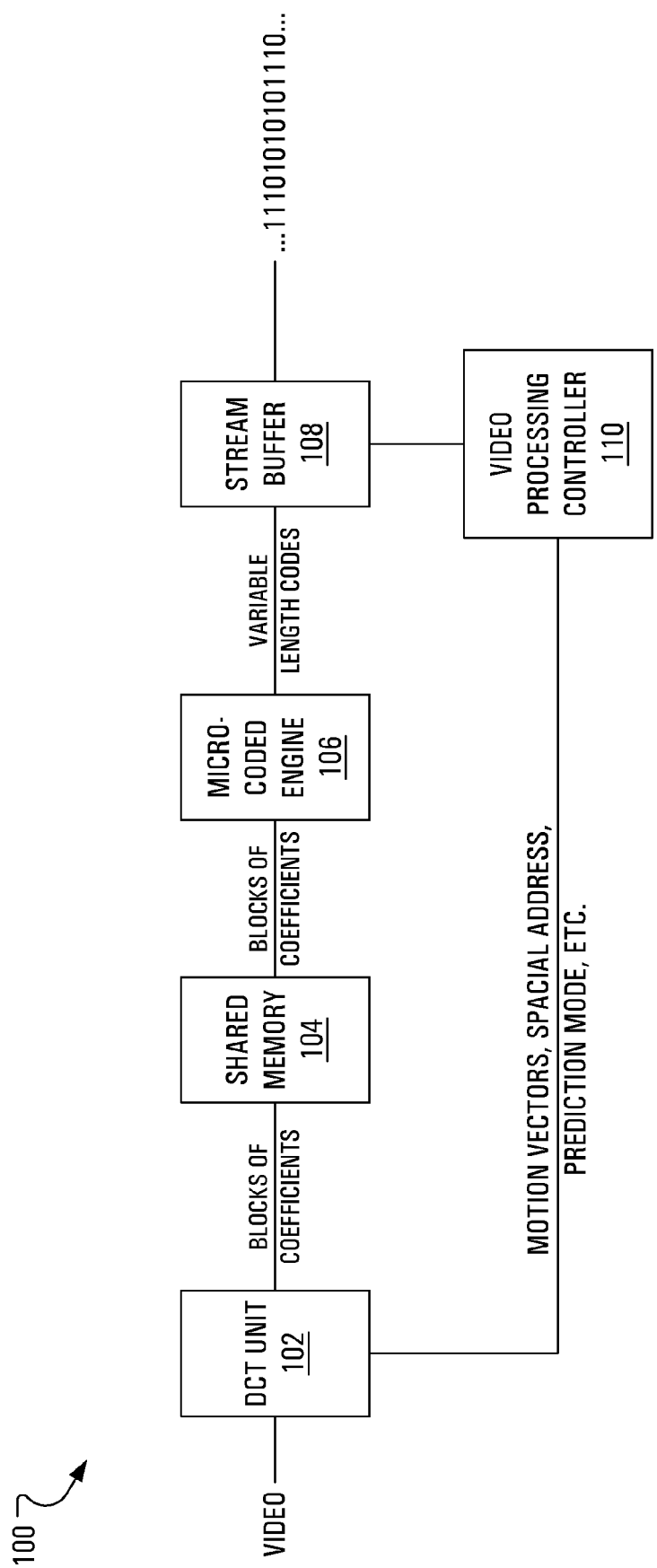
FIG. 1 illustrates a video CODEC circuit employing a programmable microcoded engine according to an embodiment of the present invention.

FIG. 1 illustrates a video CODEC (COder-DECoder) circuit 100 for use in encoding and decoding a digital video sequence. A digital video sequence may be considered a series of digital still images, where each digital still image is described by values of picture elements, called "pixels". A discrete cosine transform (DCT) unit 102 may be used to represent the digital still images as arrays of quantized coefficients. The DCT unit 102 may also implement motion compensation techniques, and other techniques, to reduce the total number of arrays of quantized coefficients and to reduce the number of non-zero coefficients per array of quantized coefficients. The arrays may then be stored in a shared memory 104, where the arrays may be accessed by a programmable microcoded engine 106 for processing variable length coded data. The microcoded engine 106 may use the arrays to generate variable length coded data representative of the arrays of coefficients. The variable length coded data may then be output to a stream buffer 108 under control of a video processing controller 110. The video processing controller 110 may also insert additional syntax elements (both fixed and variable length) among the variable length coded data produced by the microcoded engine 106.

Figure 2:
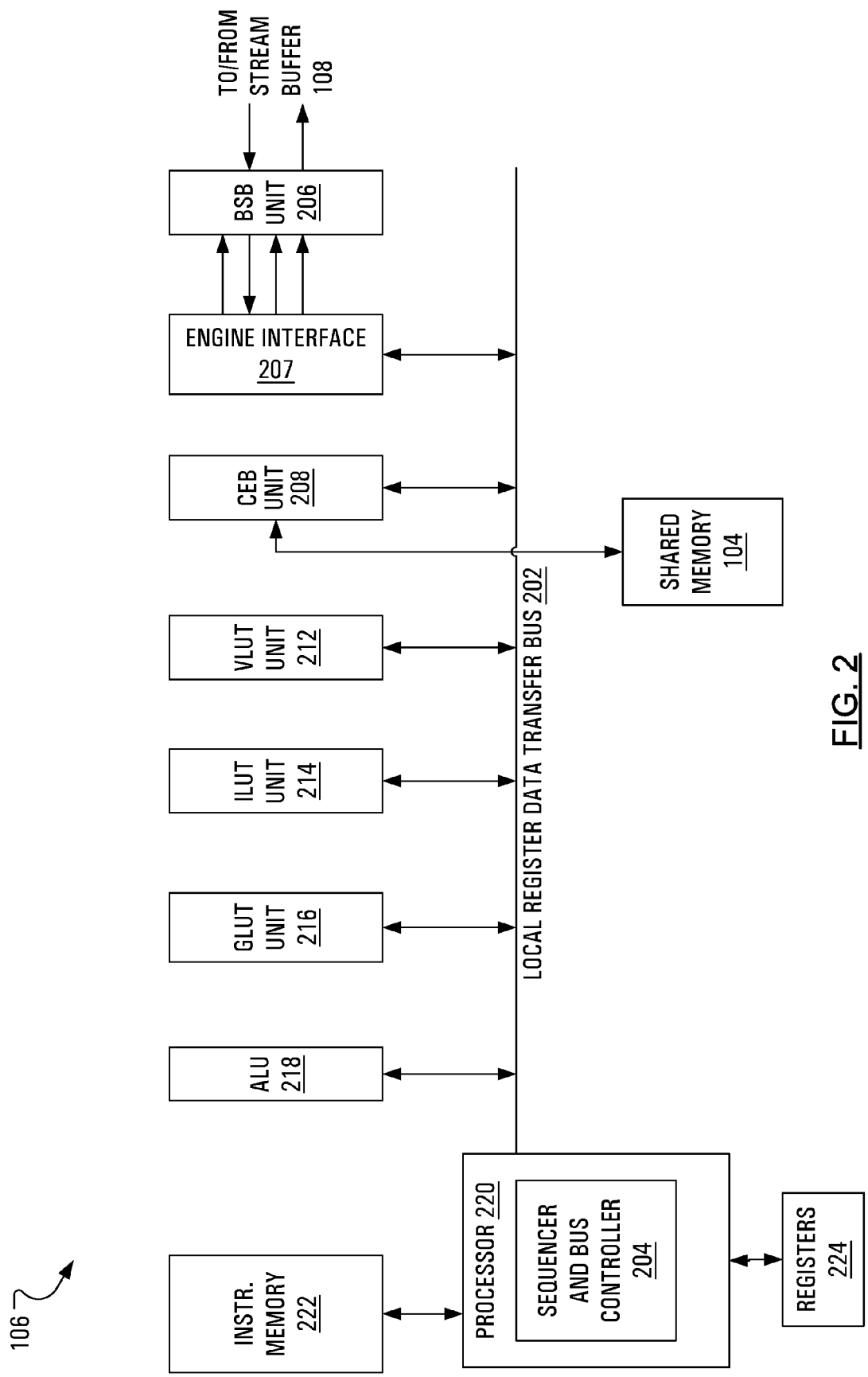
FIG. 2 illustrates the microcoded engine of FIG. 1 including a coefficient buffer unit and various lookup table units according to an embodiment of the present invention.

FIG. 2 illustrates, as a block diagram, the programmable microcoded engine 106. Microcode refers to low level instructions that control a microprocessor. The microcode of the microcoded engine 106 may be reprogrammed to allow the microcoded engine 106 to be adapted for use in multiple video encoding and decoding applications, i.e., encoding and decoding according to a selected standard among multiple standards.

The microcoded engine 106 includes a processor 220 for executing a sequence of instructions stored in an instruction memory 222. The instruction memory 222 has a plurality of instruction memory locations. Associated with the processor 220 is a plurality of registers, where each register is for storing a pointer to a particular instruction memory location in the instruction memory 222.

The microcoded engine 106 includes a local register data transfer bus 202 that includes an address bus and a data bus and is controlled by a sequencer and bus controller 204 within the processor 220. An array of special processing units are connected for communication through the local register data transfer bus 202.

The special processing units may include a bitstream buffer (BSB) unit 206 for providing read access to bitstreams stored in the stream buffer 108 that include variable length binary strings. Equally, the BSB unit 206 may write bitstreams to the stream buffer 108, where the bitstreams include variable length binary strings. The BSB unit 206 may communicate with the local register data transfer bus 202, and thereby with the rest of the special processing units, via an engine interface 207.

The special processing units may also include a Co-Efficient Buffer (CEB) unit 208. As will be described, the CEB unit 208 may be arranged to perform scan conversion on-the-fly from a random access memory (RAM) based scan table. The CEB unit 208 may also, when encoding, handle creation of a zero/non-zero flag vector as part of a direct memory access (DMA) operation, which transfers coefficients from the shared memory 104. The CEB unit 208 may also, when decoding, force coefficients to zero as part of the DMA operation that transfers coefficients to the shared memory 104, based on the zero/non-zero flag vector. The CEB unit 208 may also transpose columns of coefficients to allow for efficient burst access.

The special processing units may also include a Value Lookup Table (VLUT) unit 212 adapted to convert a received code index to a corresponding variable length code string and a representation of the length of the variable length code string, when encoding, or to convert a received code index to non-zero value (level) and an indication of separation from a prior non-zero value (nm), when decoding. The output of the VLUT unit 212 may be processed through a set of programmable barrel shifters in an arithmetic logic unit (ALU) 218, which programmable barrel shifters allow single cycle shifting and rotating of data words. Such processing may be seen to allow for efficient alignment of the various output bit fields in different modes.

The special processing units may also include an Index Lookup Table (ILUT) unit 214 adapted to, in a decode mode, find the codebook index of a variable length code applied to the ILUT unit 214 and, in an encode mode, find a variable length code index corresponding to received codebook symbol information applied to the ILUT unit 214, dependent upon the setting of a mode bit. The ILUT unit 214 may be RAM-based or Content Addressable Memory-based.

The special processing units may also include a General Purpose Lookup Table (GLUT) unit 216. The GLUT unit 216 may be particularly useful for determining when level and run values exceed limits in a table that maps such level and run values to variable length codes.

As mentioned in passing above, the special processing units may include conventional elements, such as the ALU 218. As with known ALUs, the ALU 218 employs a collection of logic gates to perform operations such as addition, subtraction, and multiplication of integers as well as bit-wise Boolean operations (e.g., AND, OR, NOT, XOR).

In FIG. 2, the local register data transfer bus 202 is shown abstractly. In practice, the address bus and data bus that make up the local register data transfer bus 202 can be implemented through tri-state controlled buses or through the use of multiplexing logic to select among data sources, the latter being more commonly used in modem integrated circuits. Furthermore the portion of the data bus that carries data written by the sequencer and bus controller 204 may be distinct from the portion of the data bus employed to carry data read from the various special processing units 208, 212, 214, 216, 218.

Figure 3:
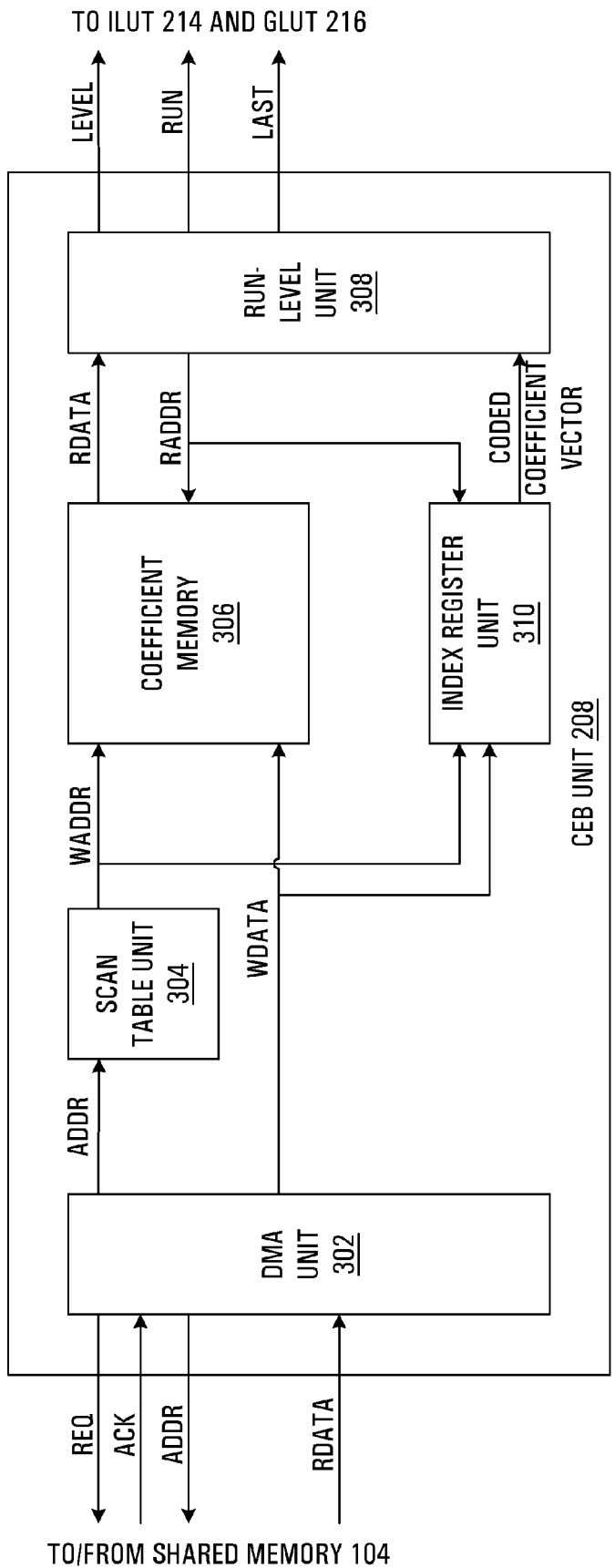
FIG. 3 illustrates the coefficient buffer unit of the programmable microcoded engine of FIG. 2 in encode mode according to an embodiment of the present invention.

The CEB unit 208, illustrated in detail in FIG. 3, includes a DMA unit 302 for reading DCT coefficients from the shared memory 104 in encode mode and writing DCT coefficients to the shared memory 104 in decode mode. In communication with the DMA unit 302 is a scan table unit 304 for converting, according to a selected scan table, a memory location specified by the DMA unit 302 to a memory location in a coefficient memory 306. Dependent upon encode or decode mode, the coefficient memory 306 may be read from, or written to, by a run-level unit 308. Access to the coefficient memory 306 may be mirrored by access to an index register unit 310 that is arranged to maintain, in an associated index register, a record of the presence or absence of a coefficient at each memory location in the coefficient memory 306.

Figure 4:
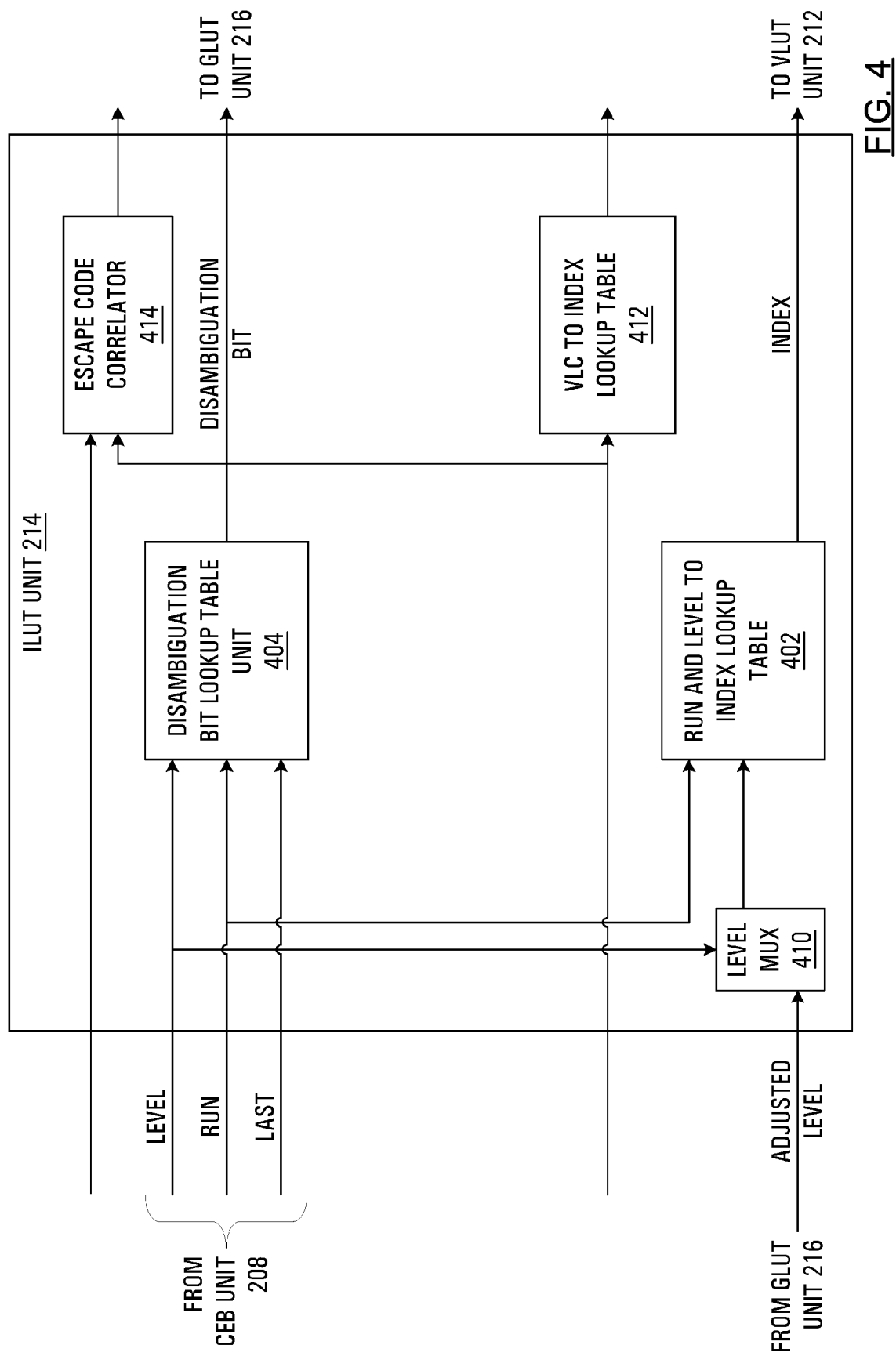
FIG. 4 illustrates an index lookup table unit of the programmable microcoded engine of FIG. 2 in encode mode according to an embodiment of the present invention.

The ILUT unit 214, illustrated in detail in FIG. 4, includes several lookup tables. For use in encode mode, the lookup tables include a run and level to index lookup table 402, a disambiguation bit lookup table unit 404, a run maxima lookup table 602 and a level maxima lookup table 604. To select between a received level value and an adjusted level value for use in the run and level to index lookup table 402, a level multiplexer (MUX) 410 is provided. For use in decode mode, the ILUT unit 214 includes a variable length code to index lookup table 412 and an escape code correlator 414.

Figure 6:
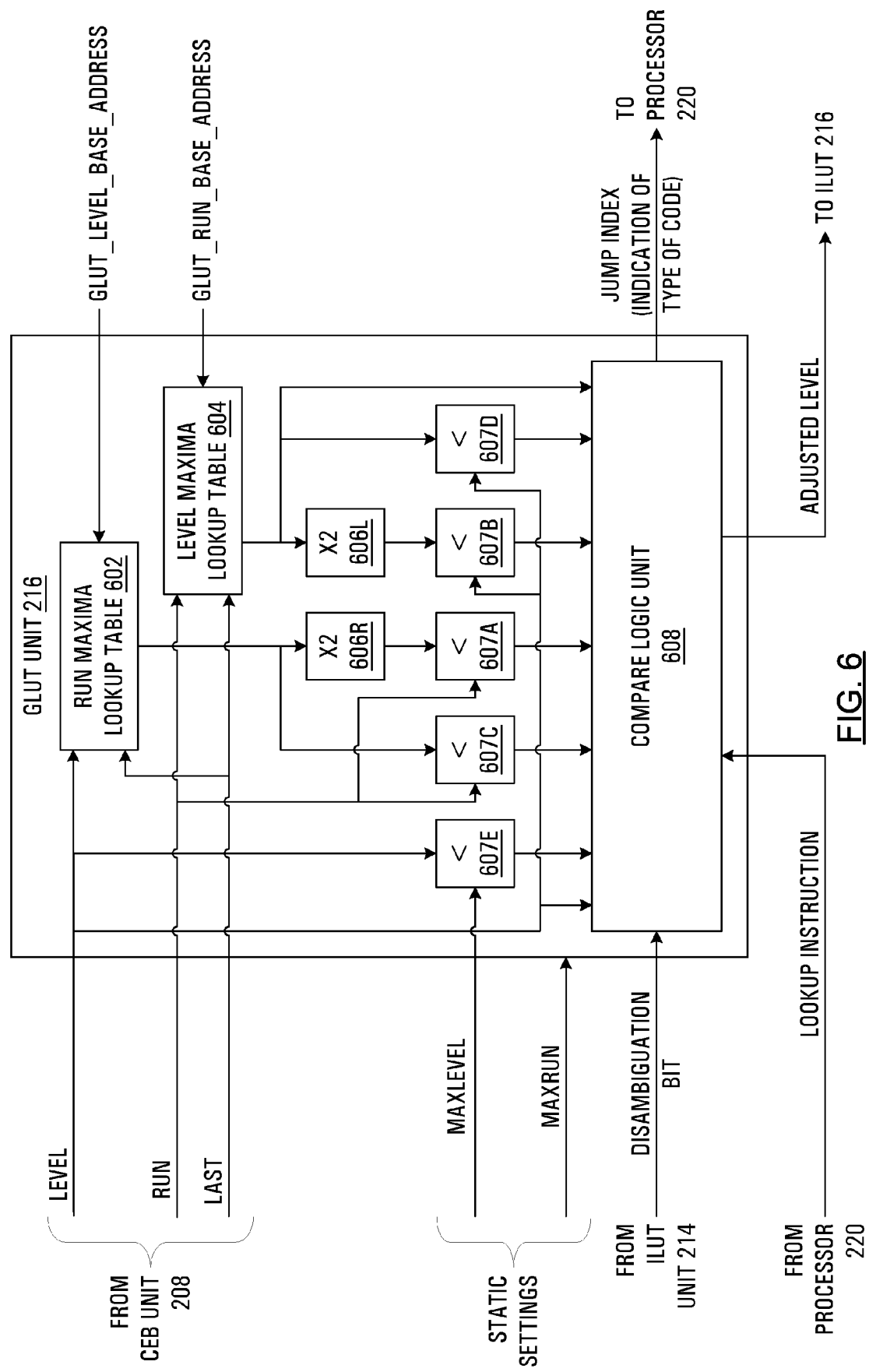
FIG. 6 illustrates a general purpose lookup table unit of the programmable microcoded engine of FIG. 2 in encode mode according to an embodiment of the present invention.

The GLUT unit 216, as illustrated in detail in FIG. 6, includes a run maxima look up table 602, which receives, as input, the level value and the last indication generated at the CEB unit 208 as well as a level base address and generates, as output, a maximum run value for the provided level value. Similarly, the GLUT unit 216 includes a level maxima look up table 604, which receives, as input, the run value and the last indication generated at the CEB unit 208 as well as a run base address and generates, as output, a maximum level value for the provided run value.

The output of the run maxima look up table 602 is received by a run multiplier 606R while the output of the level maxima look up table 604 is received by a level multiplier 606L. The output of the run multiplier 606R is received by a first comparator 607A, which also receives the run value received from the CEB unit 208. The output of the level multiplier 606L is received by a second comparator 607B, which also receives the level value received from the CEB unit 208. The output of the run maxima look up table 602 is also received by a third comparator 607C, which also receives the run value received from the CEB unit 208. Similarly, the output of the level maxima look up table 604 is received by a fourth comparator 607D, which also receives the level value received from the CEB unit 208. A fifth comparator 607E receives the maximum level value from the ILUT unit 214 and the level value received from the CEB unit 208.

The output of the five comparators 607A, 607B, 607C, 607D, 607E may be received by a compare logic unit 608, whose output may be a jump index for the processor 220 and/or an adjusted level value for the ILUT unit 214. A jump index may be an indication of a particular register among the registers 224, where the particular register stores a pointer to an instruction in the instruction memory 222 that may be executed by the processor 220.

Figure 7:
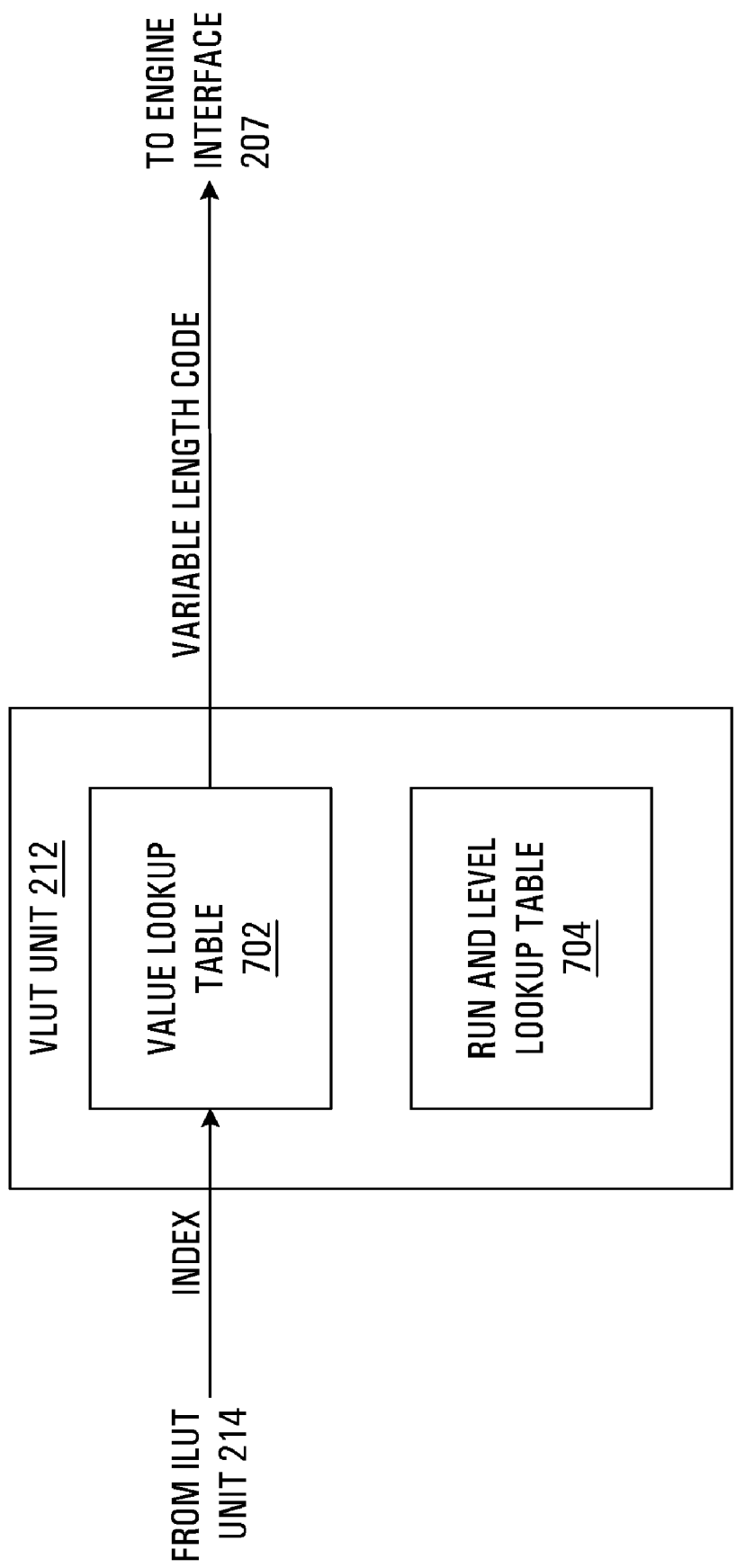
FIG. 7 illustrates a value lookup table unit of the programmable microcoded engine of FIG. 2 in encode mode according to an embodiment of the present invention.

As illustrated in FIG. 7, the VLUT unit 212 includes a value lookup table 702 for determining a variable length code based on a received index value. Alternatively, when loaded with different data, the value lookup table 702 included in the VLUT unit 212 can be used to provide a run and level lookup that may be used to determine a run value, level value and last indication based on a received index value.

Figure 8:
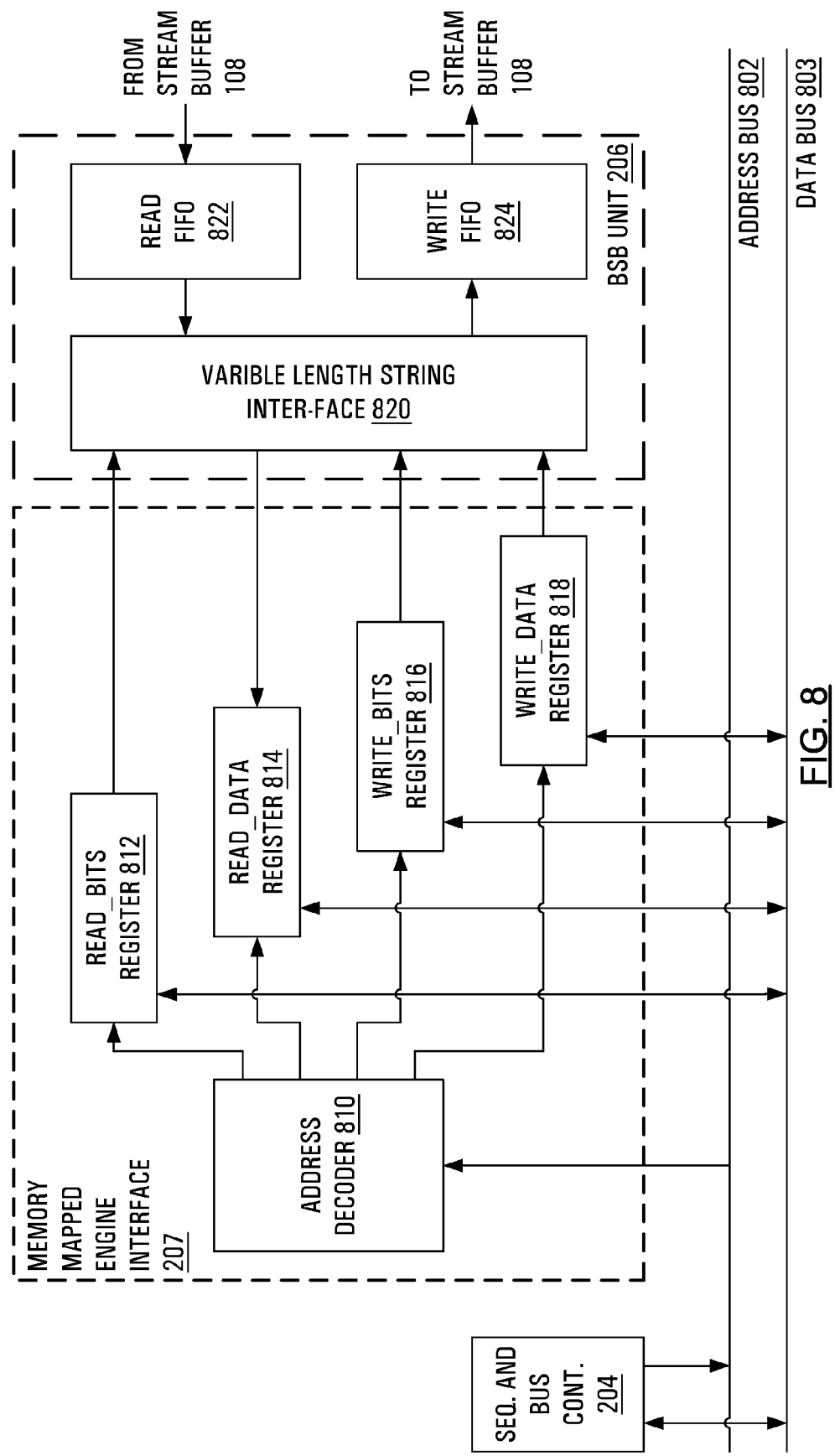
FIG. 8 illustrates, as a detailed block diagram, an engine interface and bitstream buffer unit of the programmable microcoded engine of FIG. 2.

An exemplary configuration for the engine interface 207 and the BSB unit 206 is illustrated in FIG. 8. An address decoder 810 within the engine interface 207 is connected to an address bus 802 and a data bus 803, which are part of the local register data transfer bus 202, for communication with the sequencer and bus controller 204 at the processor 220.

The address decoder 810 connects to a read_bits register 812, a read_data register 814, a write_bits register 816 and a write_data register 818, also of the engine interface 207. The four registers 812, 814, 816, 818 represent "memory mapped" ports. Storage elements, such as flip-flops, may or may not be associated with the registers 812, 814, 816, 818. Each of the registers 812, 814, 816, 818 connects both to the data bus 803 and to a variable length string interface 820. The variable length string interface 820 receives input from a read FIFO 822 and provides output to a write FIFO 824.

A drawing similar to FIG. 8 may be constructed, wherein the engine interface 207 is register mapped such that access to the BSB Unit 206 is determined by encoded instruction fields, rather than memory bus addresses.

In overview, the microcoded engine 106, with the array of special processing units connected via one or more register data transfer buses, may be employed to convert arrays of quantized DCT coefficients to variable length coded data in encode mode and to convert variable length coded data to arrays of quantized DCT coefficients in decode mode. Important to the operation of the microcoded engine 106 is the CEB unit 208 for converting the quantized DCT coefficients to level and run values in encode mode and converting level and run values to quantized DCT coefficients in decode mode. Additionally, several lookup tables 212, 214, 216 are employed for conversion between level and run values and variable length coded data representative thereof and vice versa.

In operation, the CODEC circuit 100 may be used in encoding a digital video sequence to produce variable length coded data or may be used in decoding variable length codes to produce a digital video sequence. The encoding operation may be considered first.

When the CEB unit 208 is in an encode mode, blocks of DCT coefficients are transferred from the shared memory 104 into the coefficient memory 306 and then read out as run/level/last values under the control of the processor 220. The coefficient memory 306 may be treated as a ping-pong buffer with each side holding one eight by eight block of coefficients, where a coefficient may be, for instance, represented by a 16-bit value. As is known, a ping-pong buffer contains two separate buffers so that, while data is written to one buffer, data may be read from the other buffer.

The transfer of the blocks of DCT coefficients from the shared memory 104 into the coefficient memory 306 may be arranged to occur one coefficient at a time. According to instruction received from the processor 220, the DMA unit 302 requests, from the shared memory 104, a specific coefficient by the memory location (ADDR, see FIG. 3) of the specific coefficient in the coefficient array as stored in the shared memory 104. Once the DMA unit 302 receives the specific coefficient (RDATA), the DMA unit 302 transmits the specific coefficient (WDATA) to the coefficient memory 306 while specifying the memory location (ADDR) to the scan table unit 304. The scan table unit 304 may use a selected RAM-based scan table to determine a memory location (WADDR) for the specific coefficient in the coefficient array as stored in the coefficient memory 306.

As the coefficient memory 306 receives the specific coefficient (WDATA) and the memory location (WADDR) for storing the specific coefficient, the same information is received by the index register unit 310. At the memory location (WADDR) in an index register within the index register unit 310, a binary indication of whether the specific coefficient is zero (e.g., binary indication=0) or non-zero (e.g., binary indication=1) may be recorded. Once the entire DCT coefficient array has been transferred from the shared memory 104 to the coefficient memory 306, a 64-bit (in the case of an eight-by-eight DCT coefficient array) coded coefficient vector may be generated from the bits in the index register unit 310.

According to some standards, e.g., MPEG-2, a coefficient array may be stored for encoding in a manner different from the manner in which the coefficient array was stored after creation. As illustrated in FIG. 9, a first array 902 illustrates memory locations of DCT coefficients (by reference number) in an array as stored after creation. For instance, where memory locations in the array may be referred to in an (x, y) format, where x is a horizontal index (x=0, 1, . . . , 7) and y is a vertical index (y=0, 1, . . . , 7), the memory location (2, 0) in the first array 902 holds the DCT coefficient with reference number 2.

The scan table unit 304 may be used to re-order the DCT coefficients into a "zig-zag" sequence, which is known to help to facilitate entropy coding by placing low-frequency coefficients before high-frequency coefficients.

The zig-zag sequence reordering is represented by a second array 904 in FIG. 9, in which a given memory location is represented by the reference number of the DCT coefficient occupying the given memory location in the first array 902. According to the second array 904, when the DMA unit 302 specifies memory location (0, 1) for storing the DCT coefficient with reference number 8, the second array 904 indicates memory location (2, 0) (i.e., the memory location in the first array 902 of DCT coefficient with reference number 2) for storing the DCT coefficient in the coefficient memory 306. A third array 906 in FIG. 9 illustrates the memory locations of the DCT coefficients after being written to the coefficient memory 306 in memory locations selected according to the second array 904. Continuing the example above, the DCT coefficient with reference number 8 may be found in the third array 906 in memory location (2, 0).

In a second example, according to the second array 904, when the DMA unit 302 specifies memory location (4, 4) for storing the DCT coefficient with reference number 36, the second array 904 generates memory location (7, 4) (i.e., the memory location in the first array 902 of DCT coefficient with reference number 39) for storing the DCT coefficient in the coefficient memory 306.

In this manner, a first block of coefficients may be transferred, by the DMA unit 302, from the shared memory 104 into the coefficient memory 306. Subsequently, a second block of coefficients may be transferred, by the DMA unit 302, from the shared memory 104 into the other side of the coefficient memory 306 while the first block is processed by the other special processing units of the microcoded engine 106.

Figure 10:
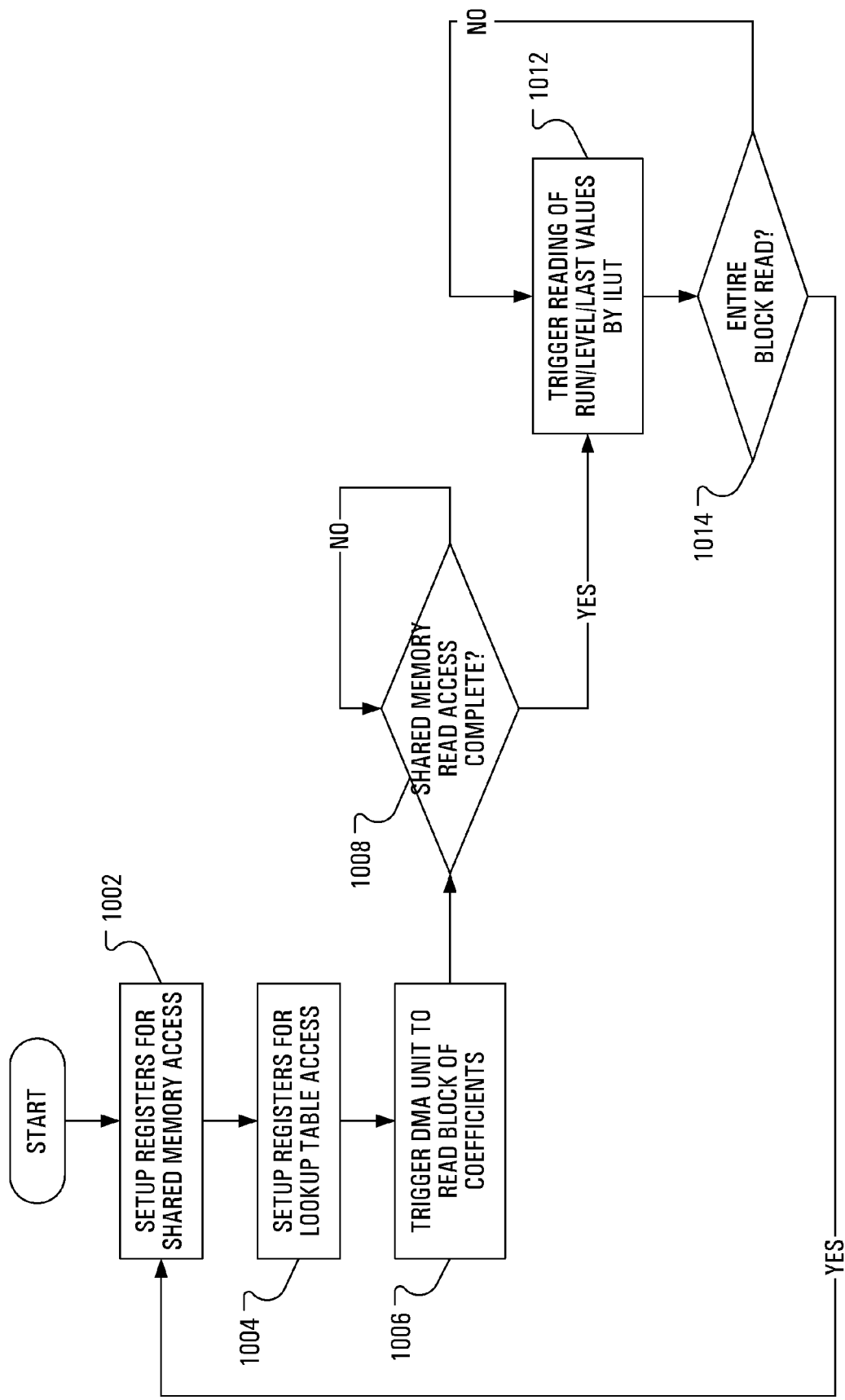
FIG. 10 illustrates steps in a method of controlling the generation of run/level/last data at the coefficient buffer unit of FIG. 3.

The sequence of events for encoding at the CEB unit 208 is illustrated in FIG. 10 to begin with the setting up of some registers in the DMA unit 302 (step 1002). Two identical sets of registers may be set up to allow for separate and independent access to the shared memory 104. The DMA registers may include: a register for indicating a start address in the shared memory 104; a register for indicating a start address in the coefficient memory 306; a register for indicating a selection of a scan table in the scan table unit 304; and a register for indicating a number of 128-bit (eight-coefficient) words to transfer for each block, e.g., eight words for an eight pixel by eight pixel block.

Registers may also be set up in the run-level unit 308 (step 1004). For example, a register may be set up to indicate a start address in the coefficient memory 306 for reading by the run-level unit 308. Additionally, a register may be set up such that writing to the register will initialize the hardware, i.e., write a zero value to each memory location in each memory location in the index register associated with the index register unit 310.

A register may also be set up to indicate a maximum number of coefficients to encode. Under normal circumstances, the value in this register is equivalent to the block size (e.g., 64 coefficients), but this register may be used to limit encoding by defining a maximum number of coefficients for which to generate variable length codes, regardless of the number of coefficients actually encoded. This register may be used by the run-level unit 308 to determine when to set the last indication.

A register may also be used to indicate a DCT block size. Such a DCT block size register may be used to establish a valid portion of the coefficient memory 306 during processing.

The processor 220 may trigger the DMA unit 302 (step 1006) to read the shared memory 104, first, by writing an indication to one of the two DMA setup registers to be used for such a purpose and, second, by writing an indication that the required operation is a DMA Read (get) operation.

The processor 220 may read a DMA status register (step 1008) to determine when the requested memory access is completed. If the DMA status register indicates that the requested memory access is ongoing, the processor 220 may wait before reading the DMA status register again. Once the processor 220 has determined that the requested memory access is complete, the processor 220 may trigger the ILUT unit 214 (step 1012) to obtain successive run/level/last data for encoding by writing to a register specifically designed to trigger such obtaining.

While triggering the ILUT unit 214 (step 1012) to obtain successive run/level/last data for encoding, the processor 220 may determine whether all the DCT coefficients in the block have been read (step 1014), or, at least, whether all the DCT coefficients to be encoded (based on an indication in the register that specifies this quantity) have been read. This determination may be made by monitoring the last indication output from the run-level unit 308. However, it should be noted that, even as the CEB unit 208 determines that all the DCT coefficients in one block have been read from one side of the coefficient memory 306, the next block is being loaded into the other side of the coefficient memory 306 from the shared memory 104.

Upon determination that all the DCT coefficients in the block have been read (step 1014), the processor 220 may set up the registers (step 1002) in the DMA unit 302 for reading the next block.

To facilitate generation of run/level/last data, the run-level unit 308 may initialize (step 1004) a record of a "read index pointer" (RIP) and a "previous read pointer" (PRP) to refer to memory locations in the coefficient memory 306 and corresponding memory locations in the Coded Coefficient Vector received from the index register unit 310.

Each time the run-level unit 308 receives an instruction from the processor 220 to produce run/level/last data (step 1012), the run-level unit 308 begins a data processing operation that may be logically equivalent to the following sequence of steps:

1) Initialize the value of the RIP to point to the first element of the vector;
2) Determine whether the value of the Coded Coefficient Vector element at the location pointed to by the RIP is zero;
3) If the value of the Coded Coefficient Vector element at the location pointed to by the RIP is zero then:
   increment the value of the RIP such that the RIP points to the next element of the Coded Coefficient Vector; and
   return to Step 2);
4) If the value of the Coded Coefficient Vector element at the location pointed to by the RIP is one then:
   determine a difference between the value of the RIP and the value of the PRP; output a value one less than the difference as the run value; and
   write the value 0 to the Coded Coefficient Vector element at the location pointed to by the RIP;
5) Output the coefficient value stored in the coefficient memory 306 at the memory location corresponding to the location pointed to by the RIP as the level value.
6) Update the value of the PRP to be equal to the value of the RIP;
7) If all of the remaining elements of the Coded Coefficient Vector, starting at the element pointed to by the RIP, are zero then set the "last" indication to 1; otherwise set the "last" indication to 0 and return to Step 2).

Note that it may be advantageous to represent the level value using a sign-and-magnitude representation, where the "level" is actually the magnitude of the coefficient value. The following discussion generally assumes that the level represents the coefficient magnitude. Note that, although the above procedure is specified sequentially, the equivalent data processing operation may be carried out in digital logic in a single processor cycle.

For example, consider the following DCT coefficient array as stored in the shared memory 104:

$$\begin{bmatrix} -474 & -68 & 102 & 0 & 45 & 70 & -57 & 42 \\ 0 & -62 & -71 & -58 & 0 & -33 & 0 & 0 \\ 0 & 73 & 41 & 64 & 0 & 0 & 0 & 0 \\ 0 & 0 & -42 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \end{bmatrix}$$

After transfer from the shared memory 104 by the DMA unit 302 according to the zig-zag pattern provided by the scan table 304, the coefficients may be stored in the coefficient memory 306 as follows:

$$\begin{bmatrix} -474 & -68 & 0 & 0 & -62 & 102 & 0 & -71 \\ 73 & 0 & 0 & 0 & 41 & -58 & 45 & 70 \\ 0 & 64 & -42 & 0 & 0 & 0 & 0 & 0 \\ 0 & 0 & -33 & -57 & 42 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \end{bmatrix}.$$

While the coefficients are being stored in the coefficient memory 306, a corresponding array is being created in the index register unit 310 as follows:

$$\begin{bmatrix} 1 & 1 & 0 & 0 & 1 & 1 & 0 & 1 \\ 1 & 0 & 0 & 0 & 1 & 1 & 1 & 1 \\ 0 & 1 & 1 & 0 & 0 & 0 & 0 & 0 \\ 0 & 0 & 1 & 1 & 1 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \\ 0 & 0 & 0 & 0 & 0 & 0 & 0 & 0 \end{bmatrix}.$$

For purposes of run value and level value determinations, the array in the coefficient memory 306 may be considered a one-dimensional coefficient vector, (−474, −68, 0, 0, −62, 102, 0, −71, 73, 0, 0, 0, 41, −58, 45, 70, 0, 64, −42, 0, 0, 0, 0, 0, 0, −33, −57, 42, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0). Additionally, the corresponding array in the index register unit 310 may be considered a coded coefficient vector, (1, 1, 0, 0, 1, 1, 0, 1, 1, 0, 0, 0, 1, 1, 1, 1, 0, 1, 1, 0, 0, 0, 0, 0, 0, 1, 1, 1, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0, 0). The coded coefficient vector may be transferred from the index register unit 310 to the run-level unit 308 for the generation of run and level values.

Upon receiving a command from the processor 220 to produce a run value and a level value, the run-level unit 308 may sequentially read bits from the coded coefficient vector and increment the read index position until a bit is read that indicates the presence of a coefficient in the coefficient memory 306. The run-level unit 308 may then determine a difference between a previous read position and the read index position and output the difference as the run value. The run-level unit 308 may then read a coefficient value from a memory location in the coefficient memory 306 corresponding to the read index position in the coded coefficient vector and output the coefficient value as the level value.

Continuing the example, the following run and level values would be generated by the run-level unit 308:
run=0, level=−474
run=0, level=−68
run=2, level=−62
run=0, level=102
run=1, level=−71
run=0, level=73
run=3, level=41
run=0, level=−58
run=0, level=45
run=0, level=70
run=1, level=64
run=0, level=−42
run=7, level=−33
run=0, level=−57
run=0, level=42

When the "last" indication has been set to 1 (see Step 7 above) the run-level unit 308 may output the last indication indicating that the remainder of coefficients for the current block of DCT coefficients are zero.

Turning to FIG. 4 and the operation of the ILUT unit 214, upon receipt of the run/level/last data, the ILUT unit 214 uses the disambiguation bit lookup table unit 404, with the run/level/last data as input, to generate a single disambiguation bit for transmission to the GLUT unit 216. According to criteria to be discussed below, the GLUT unit 216 may generate an adjusted level value. The adjusted level value may be received by the level MUX 410 along with the level value received by the ILUT unit 214. The ILUT unit 214 uses the received run value and the output of the level MUX 410 to reference the run and level lookup table 402 to generate an index for transmission to the VLUT unit 212.

The index generated by the ILUT unit 214 may be used by the VLUT unit 212 to find a Huffman code (or other prefix-free code) value corresponding to the symbol defined by the run and level values. Huffman coding uses a specific method for choosing a code value to represent each run and level combination, resulting in a prefix-free code (that is, no bit string of any code value is a prefix of the bit string of any other code value) that expresses the most common run and level combinations in the shortest way possible.

Figure 5:
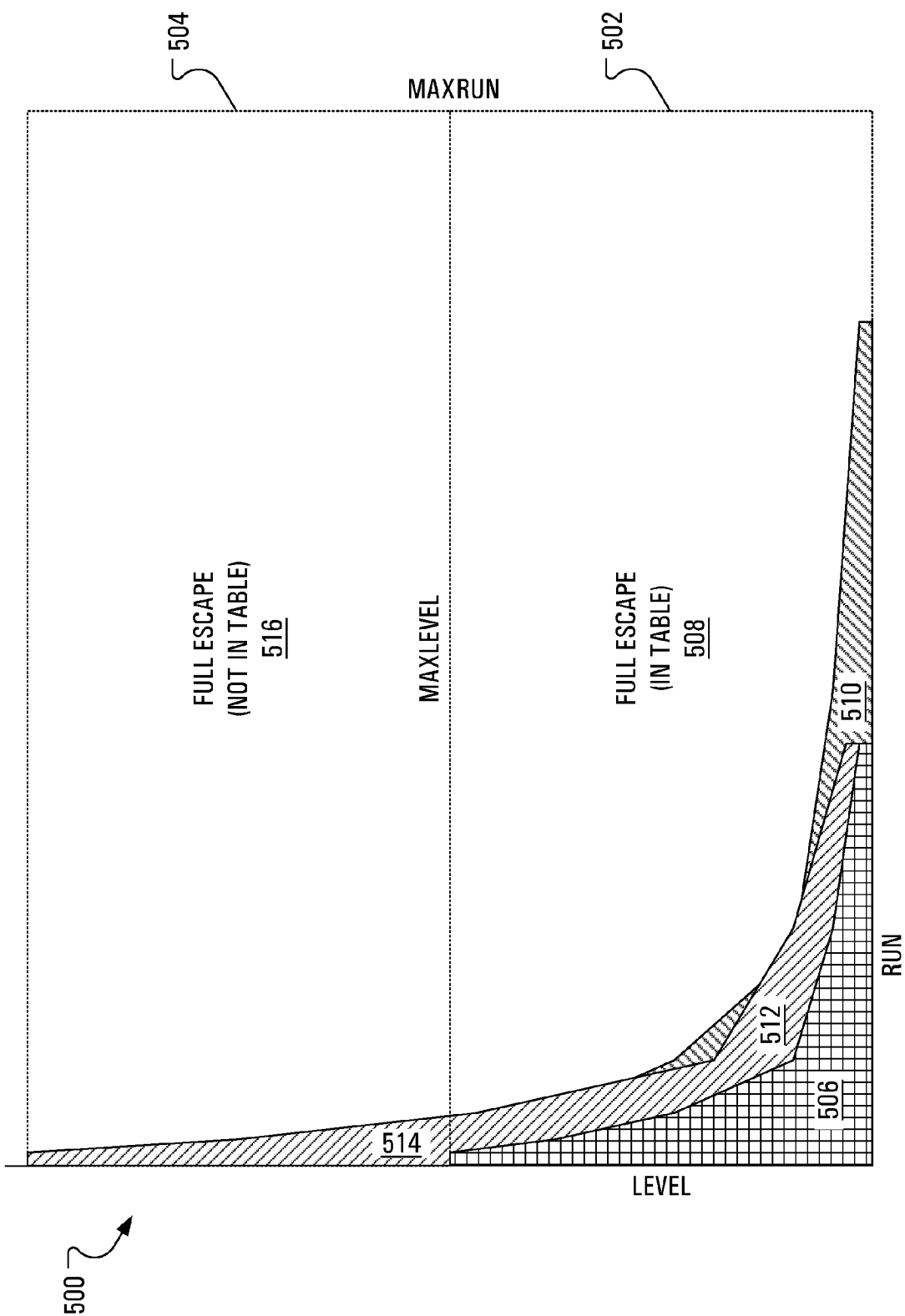
FIG. 5 illustrates a table for use in converting level and run values to variable length codes.

Codes that may be derived from run and level combinations are graphically represented in a table 500 in FIG. 5 to include an "in-table" region 502 and a "not-in-table" region 504. Within the in-table region 502, the code values that may be generated by the value lookup table 702 are called explicit codes and are specifically represented by the codes in a main region 506. The code values that fall outside the main region 506 are called escape codes and may be represented in a variety of ways.

A delta-run escape code is a code value outside of the main region 506 but inside a delta-run escape region 510. For a given run value and level value, a maximum run value supported for the given level value may be found. When the given run value exceeds the maximum run value, the maximum run value may be subtracted from the given run value to provide an intermediate run value. When a delta-run escape code is required, the ILUT unit 214 uses the run and level to index lookup table 402 to generate an index from the intermediate run value and the given level value. The index, so generated, references a code value that may be found in the main region 506.

A delta-level escape code is a code value outside of the main region 506 but inside a delta-level escape region. The delta-level escape region is divided into a delta-level escape (in-table) region 512 and a delta-level escape (not-in-table) region 514. For a given run value and level value, a maximum level value supported for the given run value may be found. When the given level value exceeds the maximum level value yet is still in the delta-level escape (in-table) region 512, the maximum level value may be implicitly subtracted from the given level value by appropriate loading of the run and level to index lookup table 402. When a delta-level escape code is required, the ILUT unit 214 uses the run and level to index lookup table 402 to generate an index from the given run value and the level value. The index, so generated, references a code value that may normally be found in the main region 506.

However, when the given level value exceeds the maximum level value and is in the delta-level escape (not-in-table) region 514, it is not possible to achieve the implicit subtraction of the maximum level value through the use of the run and level to index lookup table. As such, the ILUT unit 214 does not generate an index from the given run value and the intermediate level value. Instead, based on the information provided by the CEB unit 208 and the ILUT unit 214, the GLUT unit 216 generates an adjusted level value.

In particular, the fourth comparator 607D may compare the level value received from the CEB unit 208 to the maximum level supplied by the level maxima lookup table 604. Additionally, the second comparator 607B may compare the level value received from the CEB unit 208 to a double maximum level value supplied by the level multiplier 606L, where the double maximum level value is twice the maximum level supplied to the level multiplier 606L by the level maxima lookup table 604.

If the fourth comparator 607D indicates to the compare logic unit 608 that the level value received from the CEB unit 208 exceeds the maximum level and the second comparator 607B indicates to the compare logic unit 608 that the double maximum level value exceeds the received level value and the fifth comparator 607E indicates to the compare logic unit 608 that the received level exceeds the value MAXLEVEL, then the compare logic unit 608 may ascertain that an adjusted delta-level escape code is necessary. The compare logic unit 608 may then determine the adjusted level by subtracting the maximum level supplied by the level maxima lookup table 604 from the level value received from the CEB unit 208. The adjusted level value may then be then transmitted to the ILUT unit 214, where the adjusted level value may be received at the level MUX 410. The processor 220, having received a jump index from the GLUT unit 216 indicating an adjusted delta-level escape code as the escape code type, may arrange for the level MUX 410 to pass the adjusted level value to the run and level to index lookup table 402. When an adjusted delta-level escape code is required, the ILUT unit 214 uses the run and level to index lookup table 402 to generate an index from the given run value and the adjusted level value. The index, so generated, references a code value that may be found in the main region 506.

As the determination of a delta-run escape code or a delta-level escape code requires determination of a maximum run value for a given level value or a maximum level value for a given run value, the run maxima lookup table 602 and the level maxima lookup table 604 may be configured to provide these values to the run and level to index lookup table 402.

Among the possible run and level combinations are a set of ambiguous combinations that could lead to either a delta-run escape code or a delta-level escape code. As such, a set of rules is used at the ILUT unit 214 to determine which type of escape code to use. According to this set of rules, the disambiguation bit lookup table unit 404 may be configured to generate, for run and level combinations in the set of ambiguous combinations, a one-bit value that indicates whether the delta-run escape code or the delta-level escape code is to be used.

The disambiguation bit lookup table unit 404 may receive the run value, the level value and the last indication, where both the run value and level value are represented as a number of bits. The disambiguation bit lookup table unit 404 may then form an address by combining the run value and the level value in such a manner that the address is represented as a value having a fewer number of bits than a sum of the number of bits in the run value and the number of bits in the level value. The disambiguation bit lookup table unit 404 may then use the address to reference a disambiguation bit lookup table to determine a value for the disambiguation bit that is transmitted to the GLUT unit 216.

The level value received by the ILUT unit 214 may be used as input, along with a run base address, to the run maxima lookup table 602, which may output a maximum run value for the received level value for transmission to the run and level to index lookup table 402. Additionally, the run value received by the ILUT unit 214 may be used as input, along with a level base address, to the level maxima lookup table 604, which may output a maximum level value for the received run value for transmission to the run and level to index lookup table 402.

The run base address and the level base address may be used to provide an offset from a programming register that remains static during periods of operation. A base address may be used to allow multiple tables to exist within the run maxima lookup table 602 or the level maxima lookup table 604. In operation, one of the multiple tables may be selected through the setting of a base address rather than loading a new table each time a change is required. As should be clear, setting a single value may be considered much faster than loading an entire table.

A full escape code is a code value that includes an indication of the run value and the level value. Full escape codes may be related to run and level combinations that reference code that are in the full escape (in-table) region 508 or in the full escape (not-in-table) region 516.

In operation, the GLUT unit 216 receives run/level/last data from the CEB unit 208 as well as the disambiguation bit from the ILUT unit 214, when necessary. The GLUT unit 216 may also receive static indications of a MAXRUN value and a MAXLEVEL value, which define the in-table region 502 of the table 500 of FIG. 5. Notably, since all possible run values are in the exemplary in-table region 502 of the table 500 of FIG. 5, the received MAXRUN value is not used by the exemplary GLUT unit 216 of FIG. 6.

The GLUT unit 216 uses the received information to generate an indication of the type of code that will be generated by the VLUT unit 212. The indication of type of code, i.e., whether the code is an explicit code, a delta-run escape code, a delta-level escape code, an adjusted delta-level escape code or a full escape code, is transmitted to the processor 220 in the form of a jump index. The subsequent actions of the processor 220 are determined by the jump index.

For instance, if the type of code is indicated as an explicit code, the index generated by the ILUT unit 214 is sent to the VLUT unit 212 and a variable length code corresponding to the index is found in the value lookup table 702 (FIG. 7). The processor 220 instructs the VLUT unit 212 to send the variable length code to the BSB unit 206 via the engine interface 207.

If the type of code is indicated as a delta-run escape code, the index generated by the ILUT unit 214 is sent to the VLUT unit 212 and a variable length code corresponding to the index is found in the value lookup table 702 (FIG. 7). The processor 220 sends a code prefix indicative of the delta-run escape code-type to the BSB unit 206 via the engine interface 207 and then instructs the VLUT unit 212 to send the variable length code to the BSB unit 206 via the engine interface 207.

If the type of code is indicated as a delta-level escape code or an adjusted delta-level escape code, the index generated by the ILUT unit 214 is sent to the VLUT unit 212 and a variable length code corresponding to the index is found in the value lookup table 702 (FIG. 7). The processor 220 sends a code prefix indicative of the delta-level escape code-type to the BSB unit 206 via the engine interface 207 and then instructs the VLUT unit 212 to send the variable length code to the BSB unit 206 via the engine interface 207.

If the type of code is indicated as a full escape code, the VLUT unit 212 is not used and the index output from the ILUT unit 214 may be ignored. The processor 220 sends a code prefix indicative of the full escape code-type to the BSB unit 206 via the engine interface 207 and then sends the run value and level value to the BSB unit 206 via the engine interface 207.

This sequence of events may be repeated until a block is complete.

Notably, different tables may be loaded into the VLUT unit 212 (the value lookup table 702), the ILUT unit 214 (the run and level to index lookup table 402, the disambiguation bit lookup table unit 404) and the GLUT unit 216 (the run maxima lookup table 602, the level maxima lookup table 604, the general purpose lookup table 606) to support different compression methods and, consequently, different video encoding and decoding standards.

Reading or writing to the registers 812, 814, 816, 818 of the BSB unit 206 of FIG. 8 causes the BSB unit 206 to perform certain actions. When data is to be written to the write FIFO 824, the data value is determined by a value currently and/or previously written to the write_data register 818 and the number of bits which are to be written is controlled by values currently and/or previously written to the write_bits register 816. In one embodiment of the present invention, the act of writing a value of N to the write_bits register 816 causes the rightmost N bits previously written to the write_data register 816 to be appended to a data stream transmitted by the write FIFO 824 to the stream buffer 108.

The variable length string interface 820 combines multiple strings of bits of varying lengths into data units, each data unit having a predetermined length, for example, an integer multiple of one byte (eight bits) for convenient storage and transmission.

In exemplary operation of the present invention, to write 37 bits to the stream buffer, an element of the microcoded engine 106 writes the 37 bits to the write_data register 816. The element then writes the value 37 to the write_bits register 816. The act of writing the value 37 to the write_bits register 816 causes the variable length string interface 820 to append the 37 bits written to the write_data register 816 to a data stream transmitted to the write FIFO 824 for transmission to the stream buffer 108.

In operation, the CODEC circuit 100 may be used in encoding a digital video sequence to produce variable length coded data or may be used in decoding variable length codes to produce a digital video sequence. The decoding operation may be considered as follows.

The variable length string interface 820 extracts strings of bits of varying lengths, at arbitrary starting bit positions, from data units received at the read FIFO 822. The data units may be arranged to have a predetermined length, for example, an integer multiple of one byte.

When an element of the microcoded engine 106 performs a read on the read_data register 814, the value returned is the value of the next N bits in the stream buffer 108 connected to the read FIFO 822, relative to the "current read bit position" in the stream buffer 108. The current read bit position is controlled by values written to the read_bits register 812. When the current read bit position is to be updated, the current read bit position advances according to a value currently or previously written to the read_bits register 812.

In exemplary operation of the present invention, the stream buffer 108 presents the sequence of bits within the bitstream being processed, starting from the "current read bit position", at the read_data register 814. This sequence of bits can be fetched by the processor by performing a read operation on the read_data register 814. an element of the microcoded engine 106 writes the value 37 to the read_bits register 812. The element then performs a read on the read_data register 814. Responsive to receiving a read request via the read_data register 814, the variable length string interface 820 returns 37 bits from the read FIFO 822, starting with a bit at a "current read bit position" pointed to by a bit read pointer in the variable length string interface 820. The current read bit position is then incremented by 37. In exemplary operation of the present invention the "current read bit position" may be advanced by 37 bits by writing the value 37 to the read_bits register.

Figure 11:
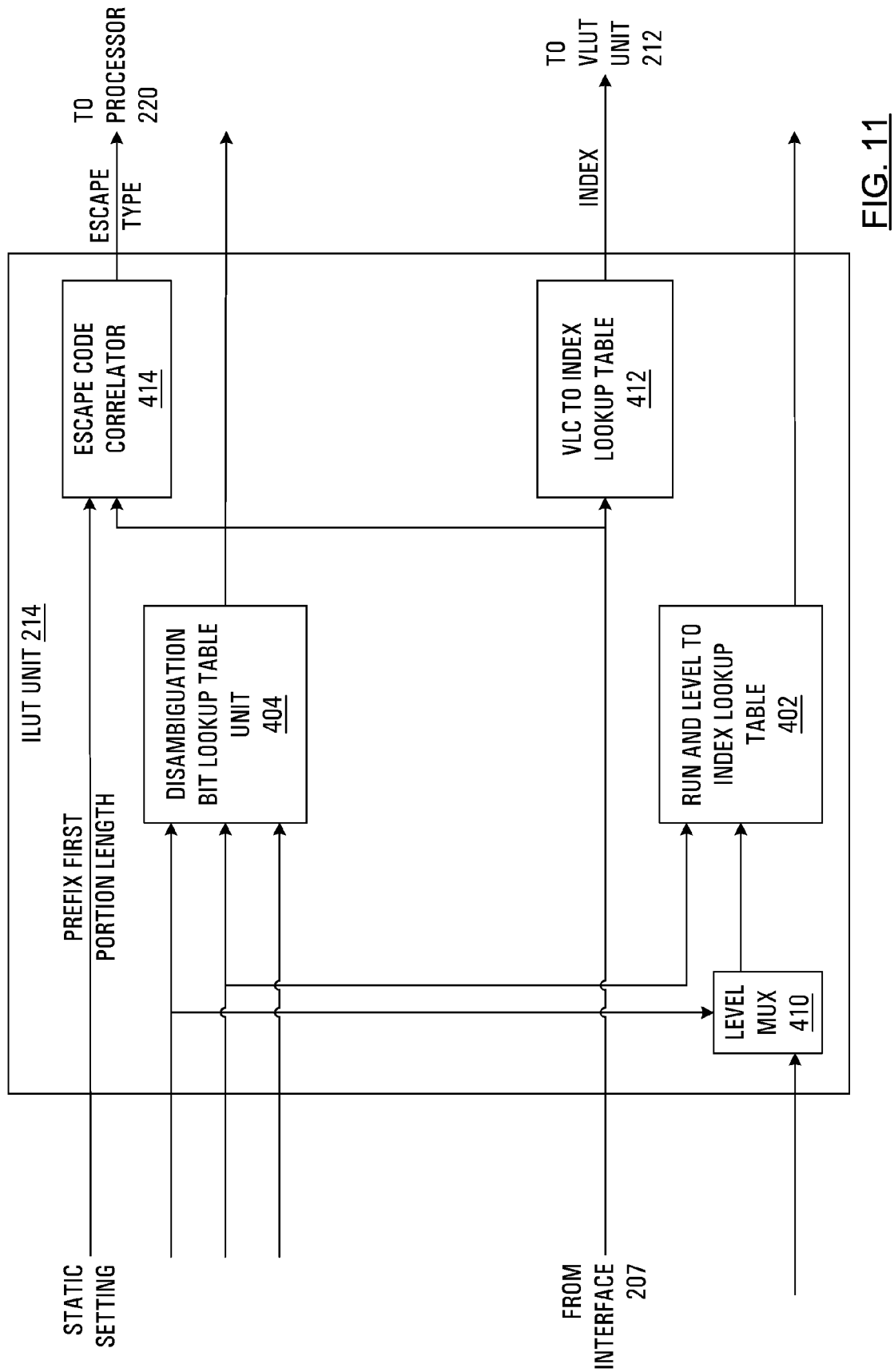
FIG. 11 illustrates the index lookup table unit of FIG. 4 in decode mode according to an embodiment of the present invention.

Once a variable length code has been read from the stream buffer 108 via the engine interface 207 and the BSB unit 206, the processor 220 transfers the variable length code to the ILUT unit 214 (see FIG. 11). The ILUT unit 214 uses the variable length code to index lookup table 412 to generate an index based on the variable length code and also uses the escape code correlator 414 to determine a type of escape code. Based on the type of escape code, the ILUT unit 214 may send a jump index to the processor 220.

A variable length code that includes an escape code may be considered to have two major parts: a code prefix; and a code value. The code value may be selected to represent a particular combination of run value and level value in the case of the delta-run escape code-type and the delta-level escape code-type. Alternatively, the code value may be selected to precisely set out a run value and a level value in the case of the full escape code-type. The code prefix includes a first portion to indicate an escape code and a second portion to indicate a particular type of escape code.

Figure 12:
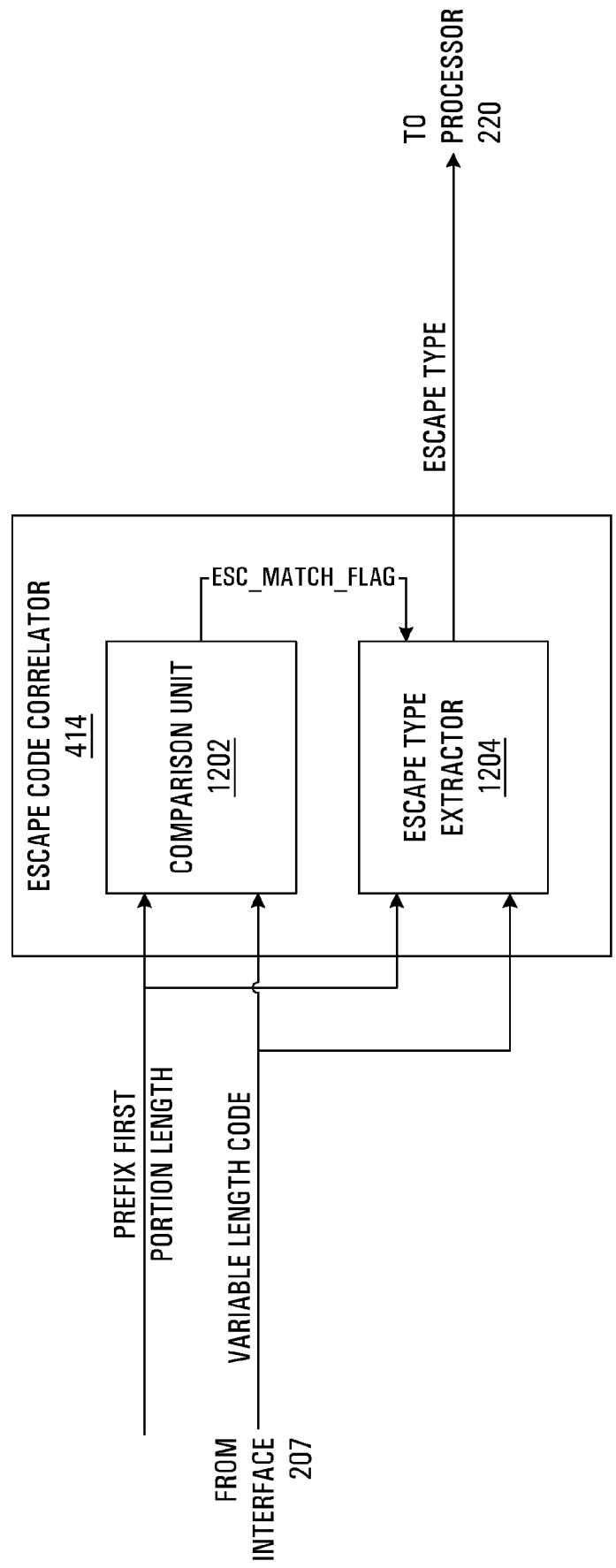
FIG. 12 illustrates an escape code correlator of index lookup table unit of FIG. 11 according to an embodiment of the present invention.

The escape code correlator 414 receives the variable length code and an indication of the length of the first portion of the code prefix. Where the length of the first portion of the code prefix is N bits, a comparison unit 1202 (see FIG. 12) compares the first N bits of the received variable length code to the known escape code indication. Where a match is found, the comparison unit 1202 generates an ESC_MATCH_FLAG signal indicating the match. Where a match is not found, the comparison unit 1202 does not generate a signal. The ESC_MATCH_FLAG signal may be received by an escape type extractor 1204.

The escape type extractor 1204 also receives the variable length code and the indication of the length of the code prefix. Additionally, the escape type extractor 1204 may be preloaded with an indication of the length of the second portion of the code prefix. Starting with the bit after the final bit of the first portion of the code prefix, the escape type extractor 1204 may record, responsive to receiving the trigger from the comparison unit 1202, the values of the bits indicative of the particular type of escape code. Based on the recorded values, the escape type extractor 1204 may generate an output string for transmission to the processor 220.

Figure 13:
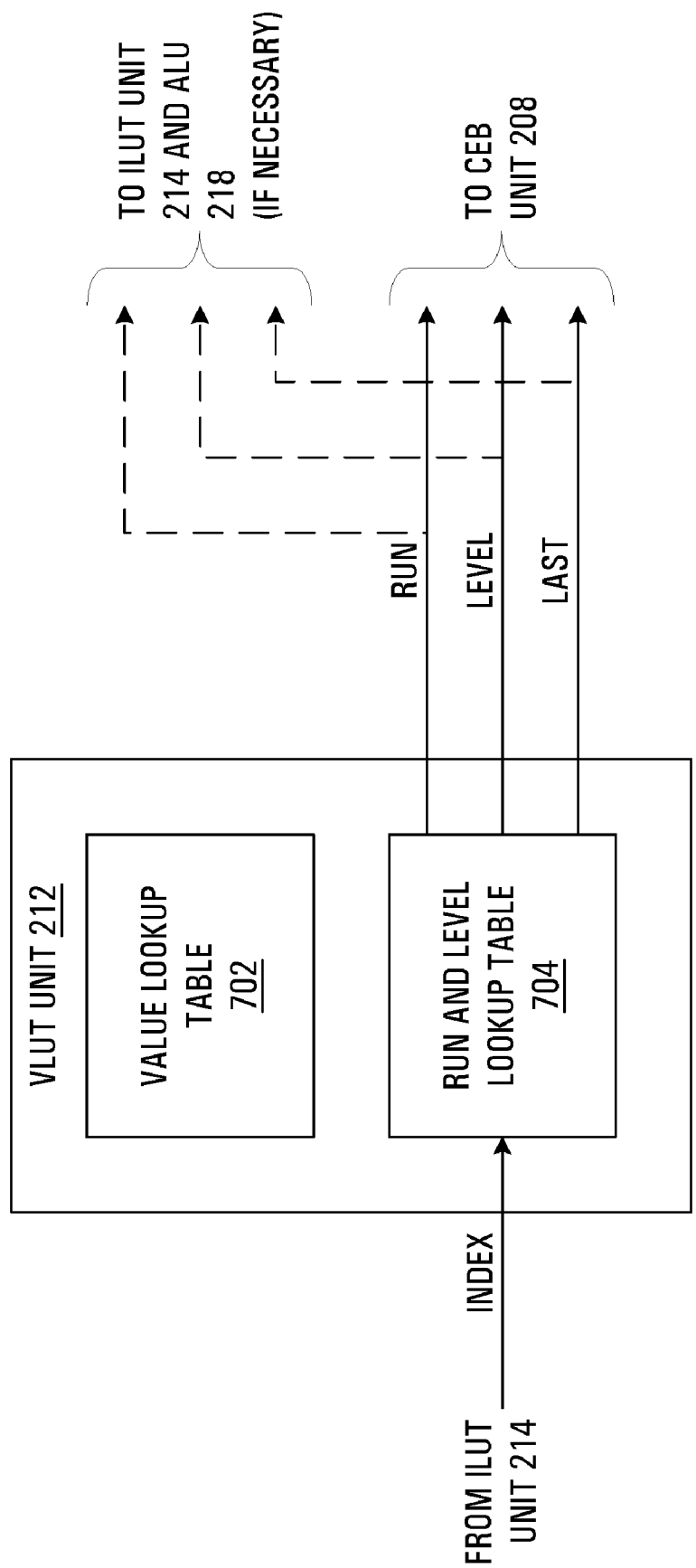
FIG. 13 illustrates the value lookup table unit of FIG. 7 in decode mode according to an embodiment of the present invention.

In one instance of operation of the ILUT unit 214, if the type of code is indicated as an explicit code, the index generated by the ILUT unit 214 is transferred to the VLUT unit 212. The VLUT unit 212 finds a level value and a run value in the value lookup table 702 (FIG. 13) based on the received index. The level value and the run value are then transferred to the CEB unit 208 according to instruction from the processor 220.

If the type of code is indicated as a delta-run escape code, the index generated by the ILUT unit 214 is sent to the VLUT unit 212. The VLUT unit 212 finds a level value and a run value in a run and level lookup table 704 (FIG. 13) based on the received index. Additionally, the level value is sent to the ILUT unit 214 and the run value is sent to the ALU 218. At the ILUT unit 214, a maximum run may be generated at the run maxima lookup table 604 for the received level value. The processor may then execute an instruction to transfer the maximum run to the ALU 218. At the ALU 218, the run value is added to the maximum run to generate an adjusted run value, which is received at the CEB unit 208 along with the level value determined by the VLUT unit 212.

If the type of code is indicated as a delta-level escape code, the index generated by the ILUT unit 214 is sent to the VLUT unit 212. The VLUT unit 212 finds a level value and a run value in the run and level lookup table 704 based on the received index. Additionally, the run value is sent to the ILUT unit 214 and the level value is sent to the ALU 218. At the ILUT unit 214, a maximum level may be generated at the level maxima lookup table 604 for the received run value. The processor may then execute an instruction to transfer the maximum level to the ALU 218. At the ALU 218, the level value is added to the maximum level to generate an adjusted level value, which is received at the CEB unit 208 along with the run value determined by the VLUT unit 212.

If the type of code is indicated as a full escape code, neither the VLUT unit 212 nor the ILUT unit 214 are used. The data following the full escape code indication in the variable length code, i.e., the level value and the run value, is routed directly to the CEB unit 208 by the processor 220.

Like the tables used in the encoding process, the tables used in the decoding process (the variable length code to index lookup table 412, the escape code correlator 414, the run maxima lookup table 602, the level maxima lookup table 604, the run and level lookup table 704) can be changed to support different compression methods and, consequently, different video encoding and decoding standards.

At the CEB unit 208, the decode mode involves the reception of run/level/last values, presented under control of the processor 220, which are subsequently loaded into the coefficient memory 306 to form a block of DCT coefficients. The coefficients are then transferred, via the DMA unit 302, from the coefficient memory 306 to the shared memory 104. As mentioned previously, it is typical to treat the coefficient memory 306 as a ping-pong buffer with each side holding one block of coefficients.

Once an initial block is written into the coefficient memory 306 by the processor 220, a second block may be written into the other side of the coefficient memory 306 while the initial block is read by the DMA unit 302 and written to the shared memory 104.

Figure 15:
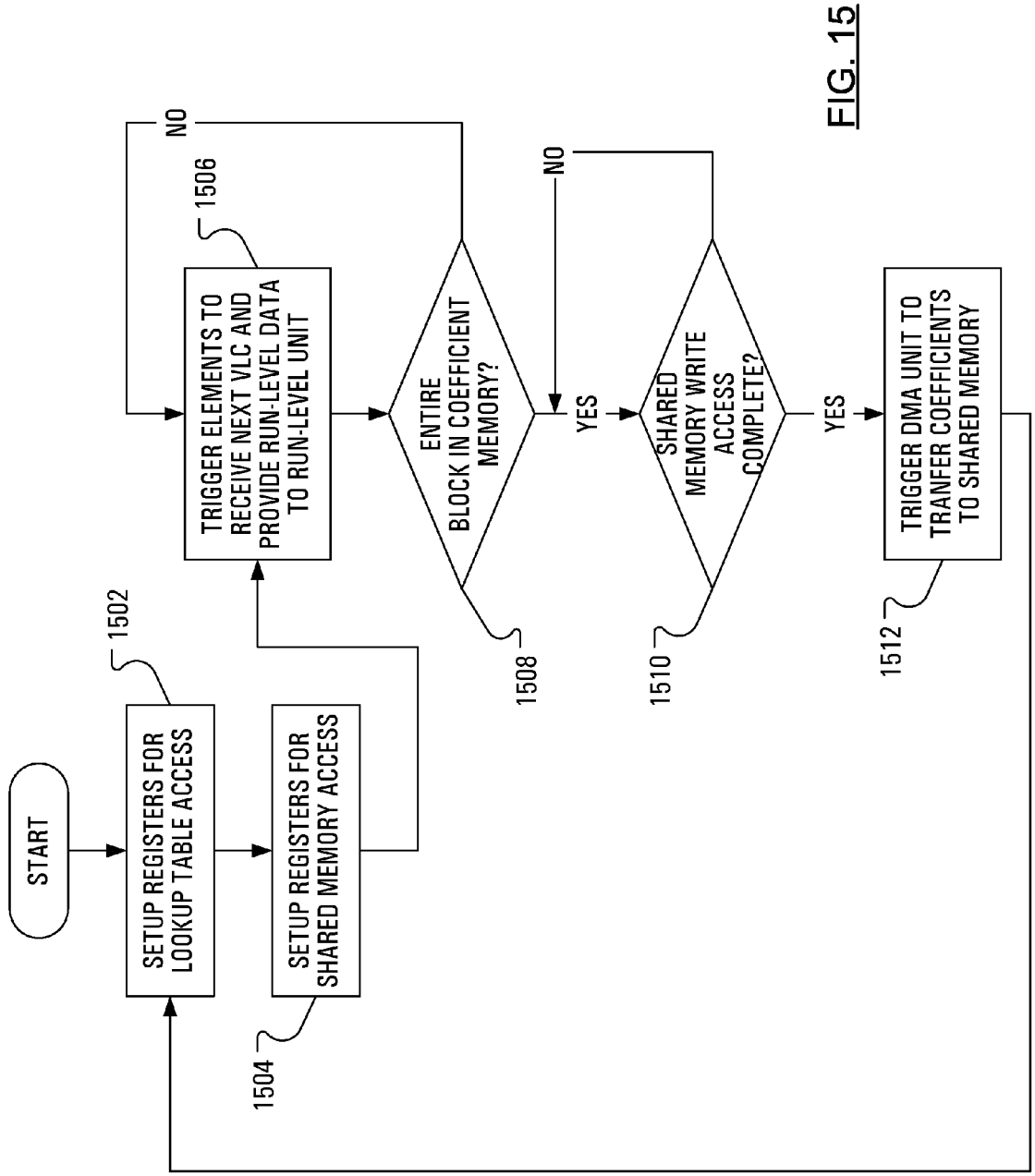
FIG. 15 illustrates steps in a method of controlling the generation of coefficients from run/level/last data at the coefficient buffer unit of FIG. 14.

The sequence of events for decoding at the CEB unit 208 is illustrated in FIG. 15 to begin with the setting up of some registers in the run-level unit 308 (step 1502). In one register, a pointer to an address within the coefficient memory 306 may be initialized (e.g., to a value of "−1"). Another register may be established such that writing to this register triggers an initialization of the index register in the index register unit 310 for run/level processing. Additionally, a register may be used to store an indication of the block size. Where the number of coefficients decoded is different from the indicated block size, it may be considered that a bitstream error has occurred.

Registers may also be set up in the DMA unit 302 (step 1504). Two identical sets of registers may be set up to allow for separate and independent access to the shared memory 104. The DMA registers may include: a register for indicating a start address in the shared memory 104; a register for indicating a start address in the coefficient memory 306; a register for indicating a selection of a scan table in the scan table unit 304; and a register for indicating a number of 128-bit (eight-coefficient) words to transfer for each block.

The processor 220 may then trigger (step 1506) the various elements of the microcoded engine 106 to start decoding the contents to the stream buffer 108 as described above and write run/level values to the CEB unit 208 until a block is complete.

Figure 16:
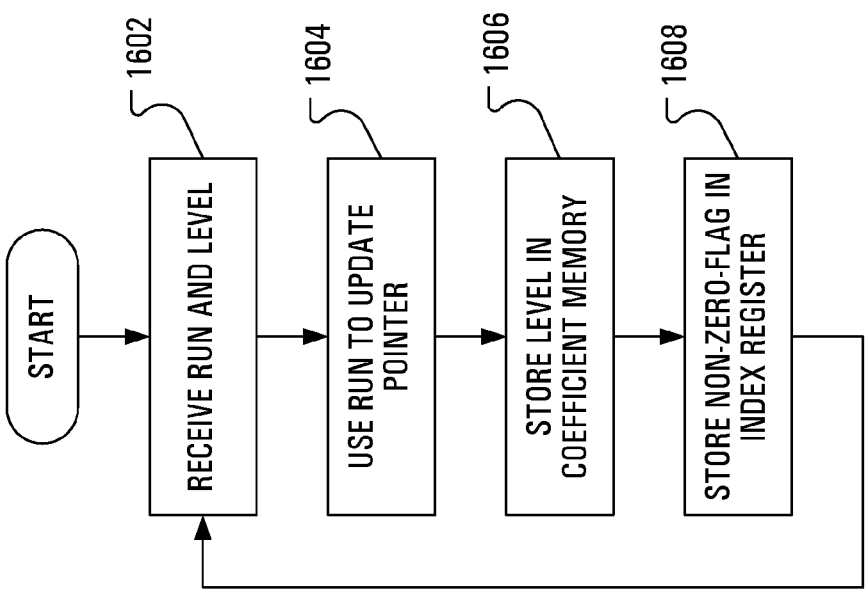
FIG. 16 illustrates steps in a method of decoding received run and level values to determine coefficient values according to an embodiment of the present invention.

FIG. 16 illustrates steps in an exemplary decoding method at the CEB unit 208. The run-level unit 308 may receive a first run value and a first level value associated with the first run value (step 1602). The first run value may be used to update the pointer (1604). In particular, the first run value may be added to the pointer, which is then further incremented by one. The first level value (WDATA) may then be stored in the coefficient memory 306 at a memory location (WADDR) specified by the updated pointer. As the run value may be considered to indicate a number of zeroes that precede the associated level value, the level value is assumed to be non-zero. Corresponding to the storage of each received level value in the coefficient memory 306, a one-bit indication of the non-zero nature of the level value (i.e., a NON_ZERO_FLAG) may be stored (step 1608) in the index register in the index register unit 310 at the memory location (WADDR) specified by the updated pointer.

Using the exemplary run and level values discussed above, the pointer may be initialized to "−1". A first set of run and level data may be received as run=0, level=−474. As such, the pointer may be incremented to 0 (pointer=pointer+run+1=−1+0+1) and the level value −474 may be stored in location 0 in the coefficient memory 306. Additionally, a binary 1 may be stored in location 0 in the index register in the index register unit 310. A second set of run and level data may be received as run=0, level=−68. As such, the pointer may be incremented to 1 (0+0+1) and the level value −68 may be stored in location 1 in the coefficient memory 306. Additionally, a binary 1 may be stored in location 1 in the index register in the index register unit 310. A third set of run and level data may be received as run=2, level=−62. As such, the pointer may be incremented to 4 (1+2+1) and the level value −62 may be stored in location 4 in the coefficient memory 306. Additionally, a binary 1 may be stored in location 4 in the index register in the index register unit 310. A fourth set of run and level data may be received as run=0, level=102. As such, the pointer may be incremented to 5 (4+0+1) and the level value 102 may be stored in location 5 in the coefficient memory 306. Additionally, a binary 1 may be stored in location 5 in the index register in the index register unit 310. A fifth set of run and level data may be received as run=1, level=−71. As such, the pointer may be incremented to 7 (5+1+1) and the level value −71 may be stored in location 7 in the coefficient memory 306. Additionally, a binary 1 may be stored in location 7 in the index register in the index register unit 310. The updating of the pointer and the storing of coefficient values in the coefficient memory 306 and storing the NON_ZERO_FLAG in the index register in the index register unit 310 continues until the block is complete.

Advantageously, at the beginning of the populating of the coefficient memory 306, the index register in the index register unit 310 is filled with zeros. At the end of the populating of the coefficient memory 306, the index register in the index register unit 310 only has values of one at locations corresponding to the memory locations in the coefficient memory 306 at which level values have been stored. As such, there is no need to perform initialization of the coefficient memory 306, which is much larger than the index register and, therefore, takes longer to initialize. Thus, a time savings is realized through the use of this method.

The processor 220 may repeatedly trigger the decoding, by the run-level unit 308, of run and level information determined, by the combination of the ILUT unit 214 and the VLUT unit 212, from a variable length code received from the stream buffer 108 (step 1506) until the processor 220 determines (step 1508) that an entire block has been written to the coefficient memory 306, e.g., by recognizing a last indication in received run/level/last information.

Once it has been determined (step 1508) that an entire block has been written to the coefficient memory 306, the processor 220 may make a determination as to whether a previously triggered DMA operation has completed (step 1510). To make such a determination, the processor 220 may read the DMA status register. Upon determining that a previously triggered DMA operation has completed (step 1510), the processor 220 may trigger (step 1512) the DMA unit 302 to read the coefficient memory 306 and write to the shared memory 104, first, by writing an indication to one of the two DMA setup registers to be used for such a purpose and, second, by writing an indication that the required operation is a DMA Write (put) operation.

Figure 14:
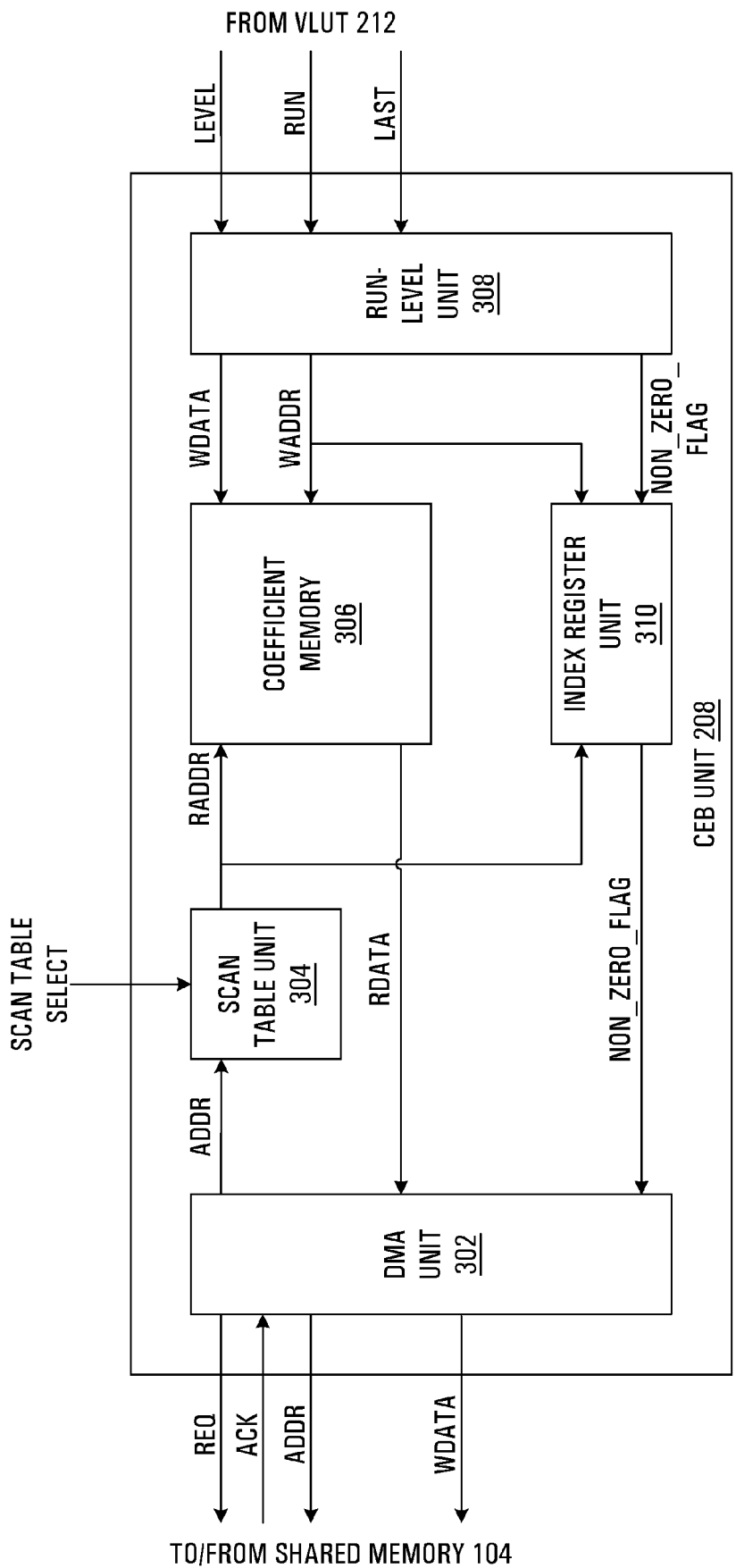
FIG. 14 illustrates the coefficient buffer unit of FIG. 3 in decode mode according to an embodiment of the present invention.

The transfer of the blocks of DCT coefficients from the coefficient memory 306 into the shared memory 104 may be arranged to occur one coefficient at a time. Alternatively groups of coefficients may be aggregated to permit larger transfers to the shared memory 104. The DMA unit 302 specifies the memory location (ADDR, see FIG. 14) of a specific coefficient to the scan table unit 304, where the memory location (ADDR) of the specific coefficient relates to a memory location in the coefficient array as it will be stored in the shared memory 104. The scan table unit 304 may use a selected RAM-based scan table to determine a read memory location (RADDR) for the specific coefficient in the coefficient array as stored in the coefficient memory 306.

The same read memory location (RADDR) is transmitted to (that is, placed on an address bus available to) the index register unit 310 to trigger a response indicating the present or absence of a coefficient in the specified memory location in the coefficient memory 306. Once the DMA unit 302 receives the specific coefficient (RDATA) and the response (NON_ZERO_FLAG) from the index register unit 310, the DMA unit 302 may consider the response from the index register unit 310.

If the response from the index register unit 310 indicates that a coefficient is present at the specified memory location, the DMA unit 302 may transmit the specific coefficient (WDATA) to the shared memory 104. If the response from the index register unit 310 indicates that a coefficient is absent at the specified memory location, the DMA unit 302 may transmit a null value (WDATA) to the shared memory 104.

At this point the processor 220 may, again, set up the registers (step 1502) in the run-level unit 308 for receiving the next block of DCT coefficients.

Once the processor 220 has determined that the requested memory access is complete, the transfer of the block from the stream buffer 108 to the shared memory 104 may considered complete. However, it should be noted that, even as the CEB unit 208 completes transferring one block from one side of the coefficient memory 306 to the shared memory 104, the next block is being loaded into the other side of the coefficient memory 306.

Once a block of DCT coefficients has been transferred to the shared memory 104, the block of DCT coefficients in the shared memory 104 may then be read by the DCT unit 102 (see FIG. 1) and converted, by the DCT unit 102, to a digital video sequence.

Other modifications will be apparent to those skilled in the art.

We claim:

1. A method of handling coefficient data received from a first memory, said method comprising:
   receiving a coefficient value stored in said first memory at a given address;
   receiving an index register value stored in an index register at an address corresponding to said given address;
   determining, based on said index register value, whether to write said coefficient value to a second memory;
   receiving a read command specifying an address in said second memory;
   determining an address in said first memory based on said address in said second memory; and
   providing said address in said first memory to said first memory.

2. The method of claim 1 further comprising determining, based on said index register value, whether to write a predetermined default value to said second memory.

3. The method of claim 2 wherein said predetermined default value is a null value.

4. A direct memory access apparatus operable to:
   receive a coefficient value stored in a first memory at a given address;
   receive an index register value stored in an index register at an address corresponding to said given address;
   determine, based on said index register value, whether to write said coefficient value to a second memory;
   receive a read command specifying an address in said second memory;
   determine an address in said first memory based on said address in said second memory; and
   provide said address in said first memory to said first memory.

5. The direct memory access apparatus of claim 4, further operable to determine, based on said index register value, whether to write a predetermined default value to said second memory.

6. The direct memory access apparatus of claim 5 wherein said predetermined default value is a null value.

* * * * *